US012579915B2

(12) United States Patent
Jinta

(10) Patent No.: US 12,579,915 B2
(45) Date of Patent: Mar. 17, 2026

(54) IMAGE DISPLAY DEVICE AND ELECTRONIC DEVICE INCLUDING PIXELS IN RESPECTIVE LIGHT EMITTING REGIONS WITH DIFFERENTLY SIZED LIGHT-EMITTING AREAS

(71) Applicant: Sony Semiconductor Solutions Corporation, Kanagawa (JP)

(72) Inventor: Seiichiro Jinta, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 372 days.

(21) Appl. No.: 18/260,369

(22) PCT Filed: Jan. 5, 2022

(86) PCT No.: PCT/JP2022/000110
§ 371 (c)(1),
(2) Date: Jul. 5, 2023

(87) PCT Pub. No.: WO2022/153900
PCT Pub. Date: Jul. 21, 2022

(65) Prior Publication Data
US 2024/0057427 A1 Feb. 15, 2024

(30) Foreign Application Priority Data
Jan. 12, 2021 (JP) ................................. 2021-003064

(51) Int. Cl.
*G09F 9/302* (2006.01)
*H10K 59/121* (2023.01)
(Continued)

(52) U.S. Cl.
CPC ......... *G09F 9/302* (2013.01); *H10K 59/1213* (2023.02); *H10K 59/353* (2023.02);
(Continued)

(58) Field of Classification Search
CPC ......................... H10K 59/353; H10K 59/1213
See application file for complete search history.

(56) References Cited

U.S. PATENT DOCUMENTS

2020/0251539 A1 8/2020 Fu
2021/0376011 A1* 12/2021 Liu ...................... H10K 59/353
(Continued)

FOREIGN PATENT DOCUMENTS

CN 110379836 A 10/2019
CN 110430300 A 11/2019
(Continued)

OTHER PUBLICATIONS

International Search Report (PCT/ISA/210), International Application No. PCT/JP2022/000110, dated Mar. 22, 2022.

*Primary Examiner* — Michael Jung
(74) *Attorney, Agent, or Firm* — Michael Best & Friedrich LLP

(57) ABSTRACT

Provided are an image display device and an electronic device capable of suppressing burn-in.

An image display device includes a plurality of pixels arranged two-dimensionally. The plurality of pixels includes: a first pixel region including a pixel configured to emit light and transmit visible light; a second pixel region arranged around the first pixel region, and including a pixel configured to emit light with an area larger than a light-emitting area of a pixel in the first pixel region; and a third pixel region arranged around the second pixel region, and including a pixel configured to emit light with an area larger than a light-emitting area of a pixel in the second pixel region.

17 Claims, 37 Drawing Sheets

(51) Int. Cl.
  *H10K 59/35* (2023.01)
  *H10K 59/65* (2023.01)
  *H10K 59/80* (2023.01)

(52) U.S. Cl.
  CPC ....... *H10K 59/65* (2023.02); *H10K 59/80518* (2023.02); *H10K 59/877* (2023.02); *H10K 59/878* (2023.02)

(56) References Cited

U.S. PATENT DOCUMENTS

| | | | |
|---|---|---|---|
| 2022/0045151 A1* | 2/2022 | Jeong ................... | H10K 59/123 |
| 2022/0367587 A1* | 11/2022 | Li ........................ | H10K 59/131 |

FOREIGN PATENT DOCUMENTS

| | | |
|---|---|---|
| CN | 110620129 A | 12/2019 |
| CN | 110767712 A | 2/2020 |
| CN | 110914891 A | 3/2020 |
| CN | 111293158 A | 6/2020 |
| JP | 2011175962 A | 9/2011 |
| JP | 2014045166 A | 3/2014 |
| JP | 2014207105 A | 10/2014 |

* cited by examiner (a)

(b) 8: THIRD PIXEL REGION

LIGHT-EMITTING PORTION (c) 6: FIRST PIXEL REGION

CURRENT CHARACTERISTICS OF PIXEL

CHARACTERISTICS OF EL ELEMENT

*FIG. 39A*
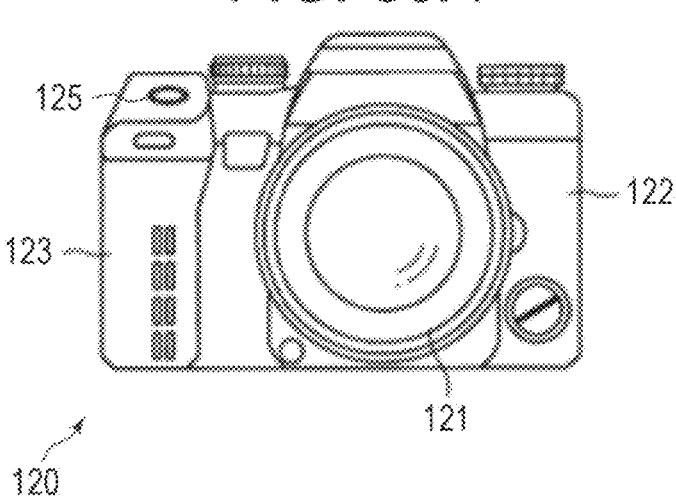
*FIG. 39B*
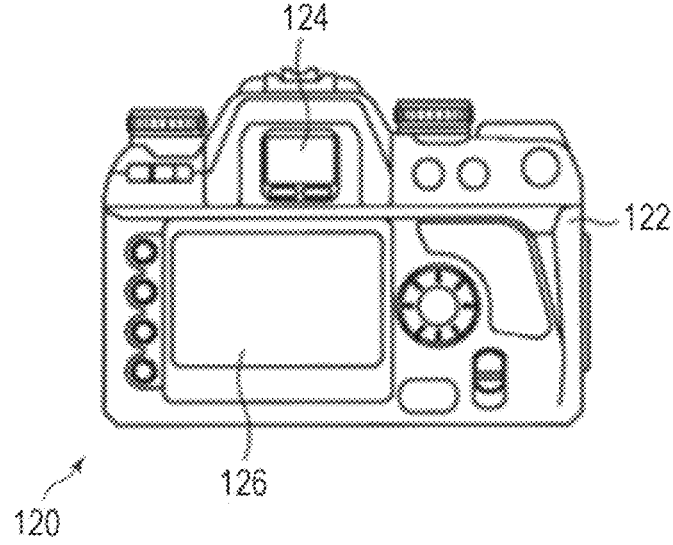
*FIG. 40A*

IMAGE DISPLAY DEVICE AND ELECTRONIC DEVICE INCLUDING PIXELS IN RESPECTIVE LIGHT EMITTING REGIONS WITH DIFFERENTLY SIZED LIGHT-EMITTING AREAS

TECHNICAL FIELD

The present disclosure relates to an image display device and an electronic device.

BACKGROUND ART

In recent electronic devices such as smartphones, mobile phones, and personal computers (PCs), various sensors such as cameras are mounted in a frame (a bezel) of a display panel. The number of mounted sensors also tends to increase, and there are a sensor for face authentication, an infrared sensor, a moving object detection sensor, and the like in addition to cameras. On the other hand, from the viewpoint of design and the tendency of making electronic devices lighter, thinner, shorter, and smaller, it is required to make an outer size of the electronic devices as compact as possible without affecting a screen size, and a bezel width tends to be narrowed. In view of such a background, a technique has been proposed in which an image sensor module is arranged immediately below a display panel, and subject light having passed through the display panel is captured by the image sensor module. In order to arrange the image sensor module immediately below the display panel, it is necessary to make the display panel transparent (see Patent Document 1).

CITATION LIST

Patent Document

Patent Document 1: Japanese Patent Application Laid-Open No. 2011-175962

SUMMARY OF THE INVENTION

Problems to be Solved by the Invention

In order to make the display panel transparent, it is necessary to provide a transmission portion that transmits visible light in at least some pixels in the display panel. However, if the transmission portion is provided in the pixel, an area of a light-emitting portion in the pixel is narrowed, and a current per unit area of a self light-emitting element such as an organic EL element (hereinafter, organic light-emitting device: OLED) is increased, deterioration of the self light-emitting element is promoted, and burn-in easily occurs. Note that the burn-in is a phenomenon in which light emission luminance decreases even when a current flowing through the light emitting element is the same. This burn-in is deterioration of current-luminance efficiency of the light emitting element, and is irreversible.

For example, in a case where the transmission portion is provided only in a partial pixel region in the display panel, specifically, in a pixel region in which the image sensor is arranged immediately below, when the burn-in occurs in this pixel region, light emission luminance of the display panel is partially lowered, and a user feels discomfort.

Therefore, the present disclosure is to provide an image display device and an electronic device capable of suppressing burn-in.

Solutions to Problems

In order to solve the problem described above, according to one aspect of the present disclosure, there is provided an image display device including:

a plurality of pixels arranged two-dimensionally, in which the plurality of pixels includes:

a first pixel region including a pixel configured to emit light and transmit visible light;

a second pixel region arranged around the first pixel region, and including a pixel configured to emit light with an area larger than a light-emitting area of a pixel in the first pixel region; and a third pixel region arranged around the second pixel region, and including a pixel configured to emit light with an area larger than a light-emitting area of a pixel in the second pixel region.

A pixel in the first pixel region may include:

a first light emitting region having a predetermined light-emitting area; and a first non-light emitting region including a first transmissive window configured to transmit visible light, a pixel in the second pixel region may include a second light emitting region having a light-emitting area larger than the predetermined light-emitting area, and a pixel in the third pixel region may include a third light emitting region having a light-emitting area larger than a light-emitting area of the second light emitting region.

A pixel in the second pixel region may include a second non-light emitting region including a second transmissive window configured to transmit visible light within a range smaller than the first transmissive window.

A pixel in the second pixel region may include a pixel circuit arranged in the second light emitting region and not arranged in the second non-light emitting region.

A pixel in the second pixel region may include a pixel circuit arranged in the second light emitting region and the second non-light emitting region.

A pixel in the first pixel region and a pixel in the second pixel region may include a plurality of color pixels configured to individually emit light in different colors, and the first transmissive window and the second transmissive window may be provided for a color pixel of a specific color.

A pixel in the first pixel region and a pixel in the second pixel region may include a plurality of color pixels configured to individually emit light in different colors, the first non-light emitting region may be provided without the first light emitting region being provided for a color pixel of a specific color in the first pixel region, and the first light emitting region may be provided without the first non-light emitting region being provided for a color pixel of a color other than the specific color, the second light emitting region and the second non-light emitting region may be provided for a color pixel of the specific color in the second pixel region, and the second light emitting region may be provided without the second non-light emitting region being provided, for a color pixel of a color other than the specific color in the second pixel region.

A pixel in the second pixel region may include a second non-light emitting region configured not to transmit visible light.

The second pixel region may include a plurality of pixels having a light-emitting area that decreases continuously or stepwise from the predetermined light-emitting area.

A pixel in the second light emitting region may include a self light-emitting element, and the self light-emitting element may include:

a lower electrode layer including a light reflecting surface;

a display layer arranged on the lower electrode layer; and an upper electrode layer arranged on the display layer.

The upper electrode layer and the display layer may include an uneven structure, and an interval between two adjacent protrusions of the uneven structure may be irregular.

A pixel group including the first pixel region and the second pixel region may be arranged at a plurality of places in the image display region while being separated from each other, and the third pixel region may be arranged around the pixel group at the plurality of places.

According to another aspect of the present disclosure, there is provided an electronic device including: an image display device including a plurality of pixels arranged two-dimensionally; and a light receiving device configured to receive light incident through the image display device, in which the image display device includes:

a plurality of pixels arranged two-dimensionally, and the plurality of pixels includes:

a first pixel region including a pixel configured to emit light and transmit visible light;

a second pixel region arranged around the first pixel region, and including a pixel configured to emit light with an area larger than a light-emitting area of a pixel in the first pixel region; and a third pixel region arranged around the second pixel region, and including a pixel configured to emit light with an area larger than a light-emitting area of a pixel in the second pixel region.

The light receiving device may receive light transmitted through the first pixel region.

A pixel in the first pixel region may include:

a first light emitting region having a predetermined light-emitting area; and a first non-light emitting region including a first transmissive window configured to transmit visible light, a pixel in the second pixel region may include a second light emitting region having a light-emitting area larger than the predetermined light-emitting area, a pixel in the third pixel region may include a third light emitting region having a light-emitting area larger than a light-emitting area of the second light emitting region, and the light receiving device may receive light transmitted through the first non-light emitting region.

A pixel in the second pixel region may include a second non-light emitting region including a second transmissive window configured to transmit visible light within a range smaller than the first transmissive window, and the light receiving device may receive light transmitted through the first light emitting region and the second non-light emitting region.

A pixel in the second pixel region may include a pixel circuit arranged in the second light emitting region and not arranged in the second non-light emitting region.

A pixel in the second pixel region may include a pixel circuit arranged in the second light emitting region and the second non-light emitting region.

4

A pixel in the first pixel region and a pixel in the second pixel region may include a plurality of color pixels configured to individually emit light in different colors, and the first transmissive window and the second transmissive window may be provided for a color pixel of a specific color.

The light receiving device may include at least one of: an imaging sensor configured to photoelectrically convert light incident through the first non-light emitting region; a distance measuring sensor configured to receive light incident through the first non-light emitting region to measure a distance; or a temperature sensor configured to measure a temperature on the basis of light incident through the first non-light emitting region.

BRIEF DESCRIPTION OF DRAWINGS

FIG. 39A is a front view of a digital camera as a second application example of the electronic device.

FIG. 39B is a rear view of the digital camera.

FIG. 40A is an external view of an HMD as a third application example of the electronic device.

MODE FOR CARRYING OUT THE INVENTION

Hereinafter, embodiments of an image display device and an electronic device will be described with reference to the drawings. Hereinafter, while principal components of the image display device and the electronic device will be mainly described, the image display device and the electronic device may have components and functions that are not illustrated or described. The following description does not exclude components and functions that are not illustrated or described.

First Embodiment

Figures 1, 2A:
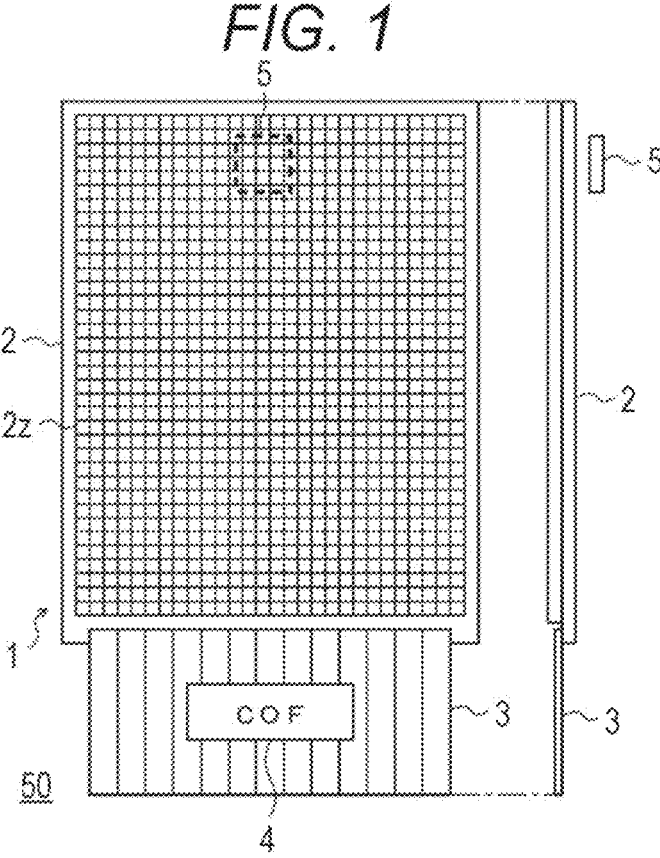
FIG. 1 is a plan view and a cross-sectional view of an electronic device including an image display device according to a first embodiment.
FIG. 2A is a view in which two sensors are arranged side by side on a back surface side on an upper side of a center of a display panel.

FIG. 1 is a plan view and a cross-sectional view of an electronic device 50 including an image display device 1 according to a first embodiment of the present disclosure. As illustrated, the image display device 1 according to the present embodiment includes a display panel 2. For example, a flexible printed circuit (FPC) 3 is connected to the display panel 2. The display panel 2 is obtained by layering a plurality of layers on, for example, a glass substrate or a transparent film, and a plurality of pixels is arranged vertically and horizontally on a display surface 2*z*. A chip on film (COF) 4 incorporating at least a part of a drive circuit of the display panel 2 is mounted on the FPC 3. Note that the drive circuit may be layered on the display panel 2 as a chip on glass (COG).

In the image display device 1 according to the present embodiment, various sensors 5 that receive light through the display panel 2 can be arranged immediately below the display panel 2. In the present specification, a configuration including the image display device 1 and the sensor 5 is referred to as the electronic device 50. While a type of the sensor 5 provided in the electronic device 50 is not particularly limited, examples of which include, for example, an imaging sensor 5 that photoelectrically converts light incident through the display panel 2, a distance measuring sensor 5 that projects light through the display panel 2 and receives light reflected by a target object through the display panel 2 to measure a distance to the target object, a temperature sensor 5 that measures a temperature on the basis of light incident through the display panel 2, and the like. In this way, the sensor 5 arranged immediately below the display panel 2 has at least a function of a light receiving device that receives light. Note that the sensor 5 may have a function of a light emitting device that projects light through the display panel 2.

In FIG. 1, an example of a specific location of the sensor 5 arranged immediately below the display panel 2 is indicated by a broken line. As illustrated in FIG. 1, for example, the sensor 5 is arranged on a back surface side on an upper side of a center of the display panel 2. Note that the arrangement location of the sensor 5 in FIG. 1 is an example, and any arrangement location of the sensor 5 may be adopted. By arranging the sensor 5 on the back surface side of the display panel 2, it is not necessary to arrange the sensor 5 around the display panel 2, a bezel of the electronic device 50 can be minimized, almost the entire region on a front side of the electronic device 50 can be made as the display panel 2, and an outer size of the electronic device 50 can be reduced without reduction of an area of the display panel 2.

Figure 2B:
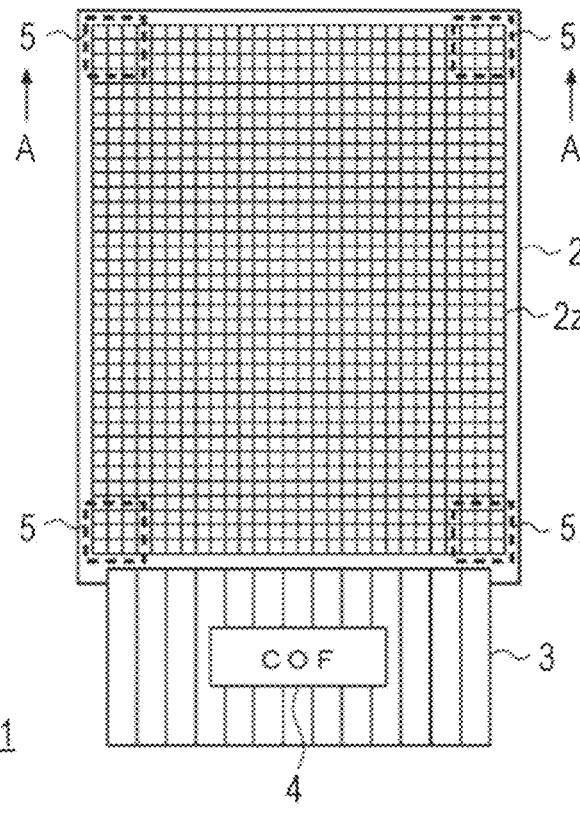
FIG. 2B is a view illustrating an example in which sensors are arranged at four corners of the display panel.

FIG. 1 illustrates an example in which the sensor 5 is arranged at one place of the display panel 2, but the sensor 5 may be arranged at a plurality of places as illustrated in FIG. 2A or 2B. FIG. 2A illustrates an example in which two sensors 5 are arranged side by side on the back surface side on an upper side of the center of the display panel 2. Furthermore, FIG. 2B illustrates an example in which the sensors 5 are arranged at four corners of the display panel 2. As illustrated in FIG. 2B, the sensors 5 are arranged at four corners of the display panel 2 for the following reason. Since a pixel region overlapping with the sensor 5 in the display panel 2 is devised to increase transmittance, there is a possibility that a slight difference occurs in display quality from a surrounding pixel region. When a human gazes at a center of a screen, the human can grasp details of a central portion of the screen, which is a central visual field, and can notice the slight difference. However, a degree of detail visibility of an outer peripheral portion, which is a peripheral visual field, becomes low. Since the center of the screen is often seen in a normal display image, it is recommended to arrange the sensors 5 at the four corners in order to make the difference unnoticeable.

In a case of arranging the plurality of sensors 5 on the back surface side of the display panel 2 as illustrated in FIGS. 2A and 2B, types of the plurality of sensors 5 may be the same or different. For example, a plurality of image sensor modules 9 having different focal lengths may be arranged, or different types of the sensors 5 such as the imaging sensor 5 and a time of flight (ToF) sensor 5 may be arranged.

In a case of arranging the sensor 5 immediately below the display panel 2, it is necessary to change a pixel structure between a pixel region (a first pixel region) overlapping with the sensor 5 on the back surface side and a pixel region (a third pixel region) not overlapping with the sensor 5. Note that, in the present specification, each pixel in the third pixel region may be referred to as a normal pixel, and each pixel in the first pixel region may be referred to as a transmissive pixel.

Figure 3:
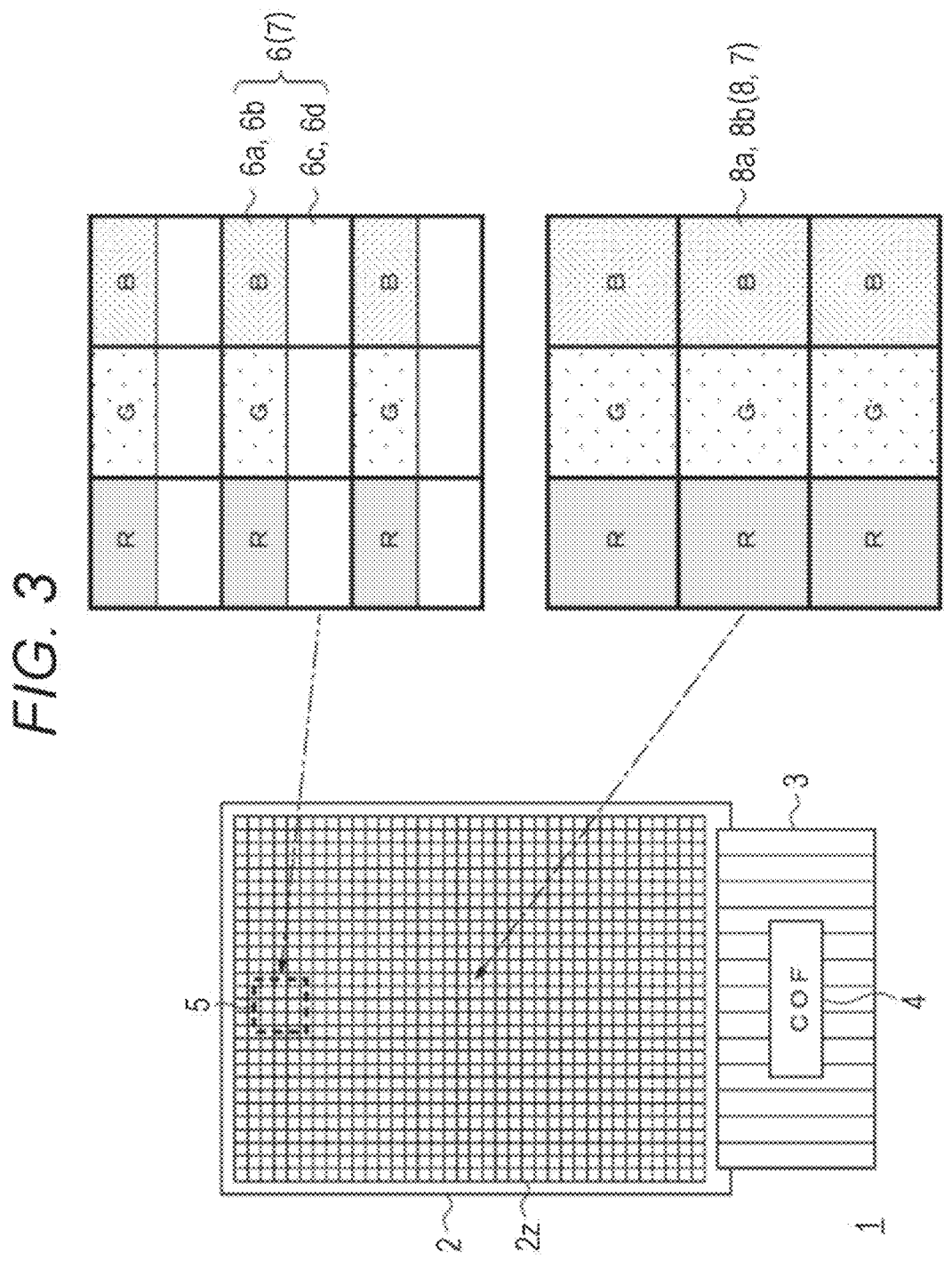
FIG. 3 is a view schematically illustrating a structure of a transmissive pixel in a first pixel region and a structure of a normal pixel in a third pixel region.

FIG. 3 is a view schematically illustrating a structure of a transmissive pixel 7 in a first pixel region 6 and a structure of a normal pixel 7 in a third pixel region 8. The transmissive pixel 7 in the first pixel region 6 includes a first self light-emitting element 6a, a first light emitting region 6b, and a first non-light emitting region 6c. The first light emitting region 6b is a region in which light is emitted by the first self light-emitting element 6a. The first non-light emitting region 6c includes a transmissive window (a first transmissive window) 6d having a predetermined shape to transmit visible light although light is not emitted by the first self light-emitting element 6a. The normal pixel 7 in the third pixel region 8 includes a third self light-emitting element 8a and a third light emitting region 8b. Light is emitted by the third self light-emitting element 8a in the third light emitting region 8b, and the third light emitting region 8b has an area larger than that of the first light emitting region 6b. Furthermore, the normal pixel 7 in the third pixel region 8 is not provided with a transmissive window.

Typical examples of the first self light-emitting element 6a and the third self light-emitting element 8a are organic electroluminescence (EL) elements (hereinafter, also referred to as an organic light emitting diode (OLED)). Since a backlight can be omitted, at least a part of the self light-emitting element can be made transparent. Hereinafter, an example in which the OLED is used as the self light-emitting element will be mainly described.

Note that, it is also conceivable to make all the pixels 7 in the display panel 2 have the same structure, instead of changing the structures of the pixels 7 in the pixel region overlapping with the sensor 5 and the pixel region not overlapping with the sensor 5. In this case, it suffices that all the pixels 7 are configured by the first light emitting region 6b and the first non-light emitting region 6c in FIG. 3 such that the sensor 5 can be overlapped and arranged at any location in the display panel 2. However, since the first light emitting region 6b has a smaller light-emitting area than the normal pixel, a current per unit area increases, and the OLED is easily deteriorated.

Figure 4:
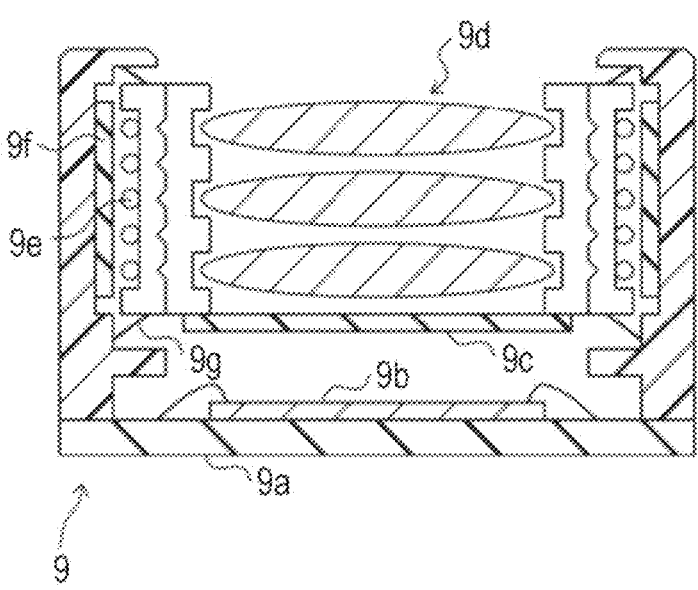
FIG. 4 is a cross-sectional view of an image sensor module as an example of a sensor.

FIG. 4 is a cross-sectional view of the image sensor module 9 which is an example of the sensor 5. As illustrated in FIG. 4, the image sensor module 9 includes an image sensor 9b mounted on a support substrate 9a, an infrared ray (IR) cut filter 9c, a lens unit 9d, a coil 9e, a magnet 9f, and a spring 9g. The lens unit 9d includes one or a plurality of lenses. The lens unit 9d is movable in an optical axis direction in accordance with a direction of a current flowing through the coil 9e. Note that an internal configuration of the image sensor module 9 is not limited to that illustrated in FIG. 4.

Figure 5:
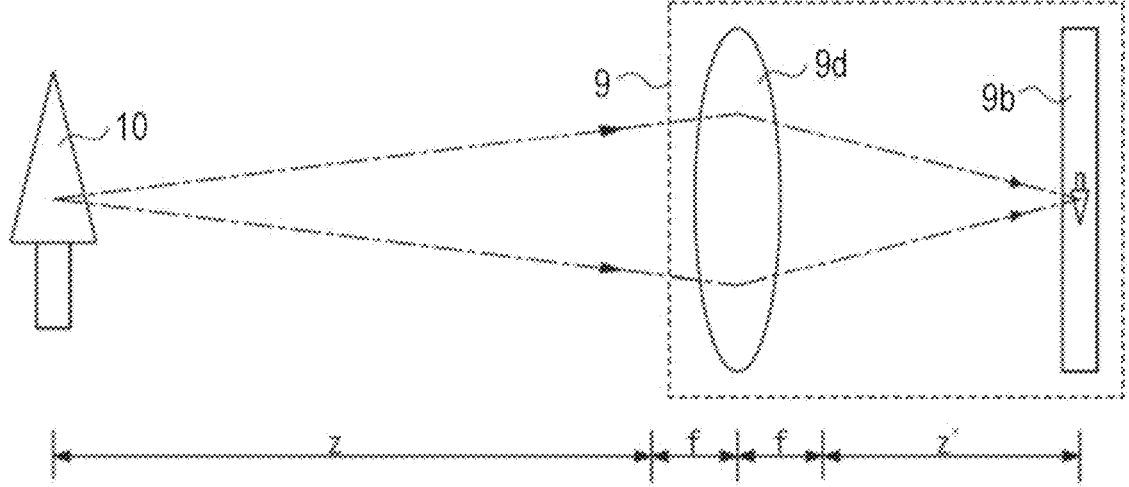
FIG. 5 is a view schematically illustrating an optical configuration of the image sensor module.

FIG. 5 is a view schematically illustrating an optical configuration of the image sensor module 9. Light from a subject 10 is refracted by the lens unit 9d, and formed as an image on the image sensor 9b. As an amount of light incident on the lens unit 9d increases, an amount of light received by the image sensor 9b also increases, and sensitivity improves. In a case of the present embodiment, the display panel 2 is arranged between the subject 10 and the lens unit 9d. When light from the subject 10 is transmitted through the display panel 2, it is important to suppress absorption, reflection, and diffraction in the display panel 2.

Figure 6:
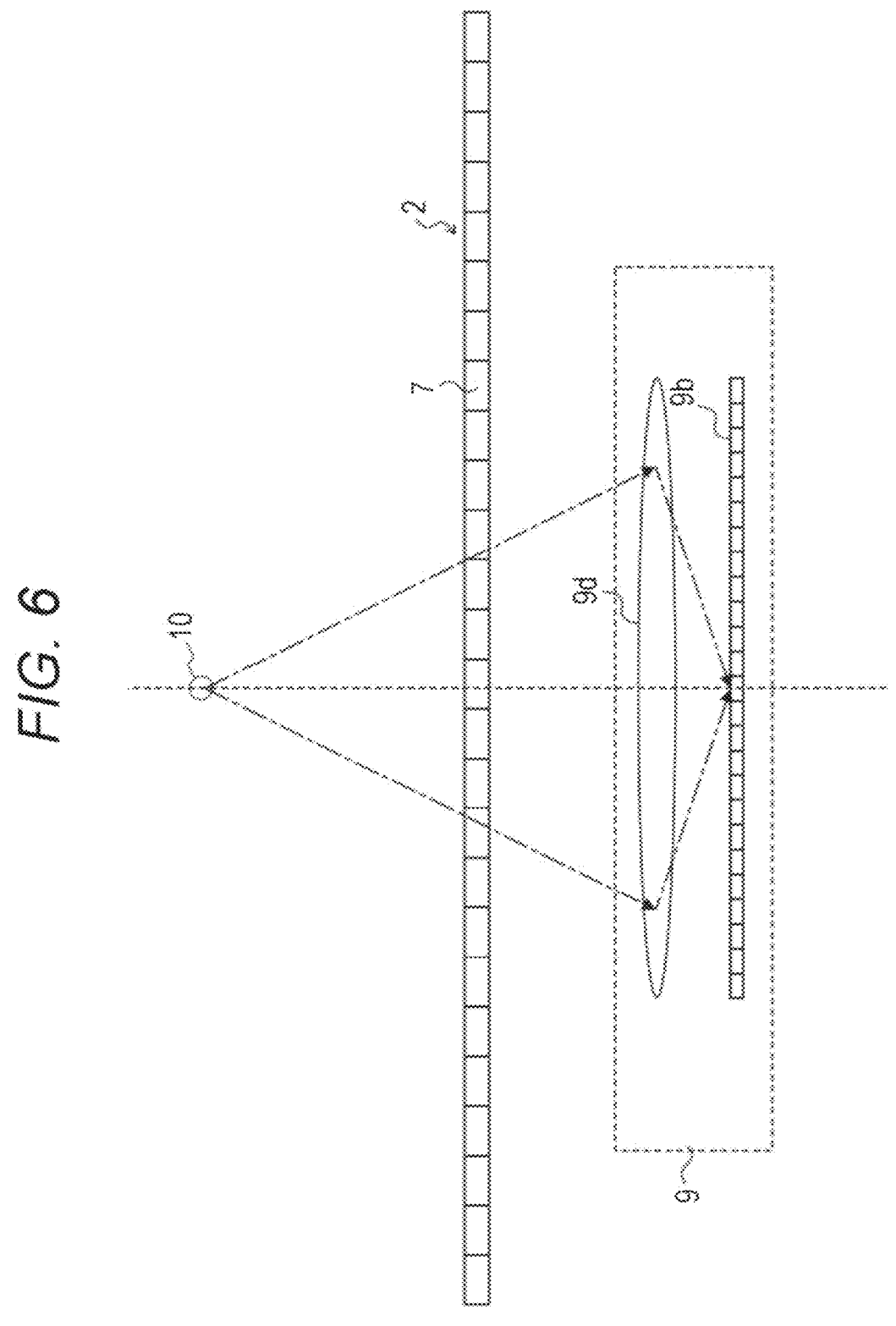
FIG. 6 is a view for explaining an optical path until light from a subject is formed as an image on an image sensor.

FIG. 6 is a view for explaining an optical path until light from the subject 10 is formed as an image on the image sensor 9b. In FIG. 6, each pixel 7 of the display panel 2 and each pixel 7 of the image sensor 9b are schematically represented by rectangular squares. As illustrated, a size of each pixel 7 of the display panel 2 is much larger than a size of each pixel 7 of the image sensor 9b. Light from a specific position of the subject 10 passes through the transmissive window 6d of the display panel 2, is refracted by the lens unit 9d of the image sensor module 9, and is formed as an image at a specific pixel on the image sensor 9b. As described above, the light from the subject 10 is transmitted through the plurality of transmissive windows 6d provided in the plurality of pixels 7 in the first pixel region 6 of the display panel 2, and is incident on the image sensor module 9.

Figure 7:
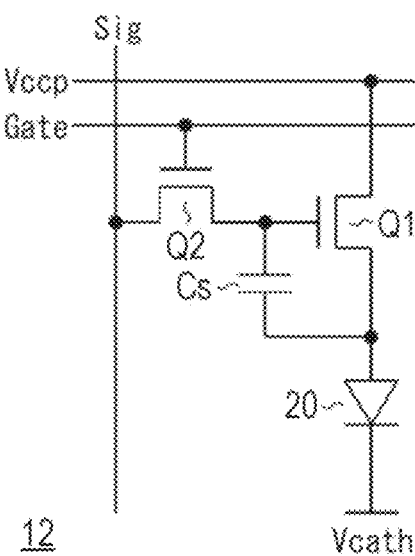
FIG. 7 is a circuit diagram illustrating a basic configuration of a pixel circuit including an OLED.

FIG. 7 is a circuit diagram illustrating a basic configuration of a pixel circuit 12 including an OLED 20. The pixel circuit 12 in FIG. 7 includes a drive transistor Q1, a sampling transistor Q2, and a pixel capacitance Cs, in addition to the OLED 20. The sampling transistor Q2 is connected between a signal line Sig and a gate of the drive transistor Q1. To a gate of the sampling transistor Q2, a scanning line Gate is connected. The pixel capacitance Cs is connected between the gate of the drive transistor Q1 and an anode electrode of the OLED 20. The drive transistor Q1 is connected between a power supply voltage node Vccp and an anode of the OLED 20.

Figure 8:
FIGS. 8(a), 8(b), and 8(c) are layout views of pixels in a display panel including the pixel circuit of FIG. 7.

FIG. 8 is a layout view of the pixels 7 in the display panel 2 including the pixel circuit 12 in FIG. 7. FIG. 8 illustrates a planar layout of a total of four color pixels 7 including two color pixels 7 horizontally and two color pixels 7 vertically.

FIG. 8(*a*) is a layout view of the pixel circuit 12 arranged below an anode electrode 12a of these color pixels, FIG. 8(*b*) is a layout view of a normal pixel in the third pixel region 8 not overlapping with the sensor 5, and FIG. 8(*c*) is a layout view of a transmissive pixel in the first pixel region 6 overlapping with the sensor 5. Note that, in the present specification, the pixel 7 and the color pixel 7 will be described with the same reference numerals for the sake of simplicity, but one pixel 7 includes a plurality of color pixels 7.

As illustrated in FIG. 8(*a*), the pixel circuit 12 is arranged in a part of the color pixel 7 in the third pixel region 8. Light emitted by the third self light-emitting element 8*a* in the pixel circuit 12 is emitted in substantially the entire region of the normal pixel 7. Therefore, as illustrated in FIG. 8(*b*), almost the entire region of the color pixel 7 becomes the third light emitting region 8*b*.

On the other hand, the transmissive pixel (the color pixel) 7 in the first pixel region 6 includes the first light emitting region 6*b* and the first non-light emitting region 6*c* as illustrated in FIG. 8(*c*). The pixel circuit 12 is arranged in the first light emitting region 6*b*, and light emitted from the first self light-emitting element 6*a* in the pixel circuit 12 is emitted in the first light emitting region 6*b* and is not emitted in the first non-light emitting region 6*c*. As described above, the color pixel 7 in the first pixel region 6 emits light with an area smaller than that of the color pixel 7 in the third pixel region 8. FIG. 8(*c*) illustrates an example in which about an upper half of the color pixel 7 in the first pixel region 6 is the first light emitting region 6*b*.

As illustrated in FIG. 8(*a*), on an upper end side of the color pixel 7, a wiring pattern for the power supply voltage Vccp and a wiring pattern for a scanning line are arranged in a horizontal direction X. Furthermore, a wiring pattern of the signal line Sig is arranged along a boundary of the color pixel 7 in a vertical direction Y. The arrangement locations of these wiring patterns are merely an example.

Figure 9:
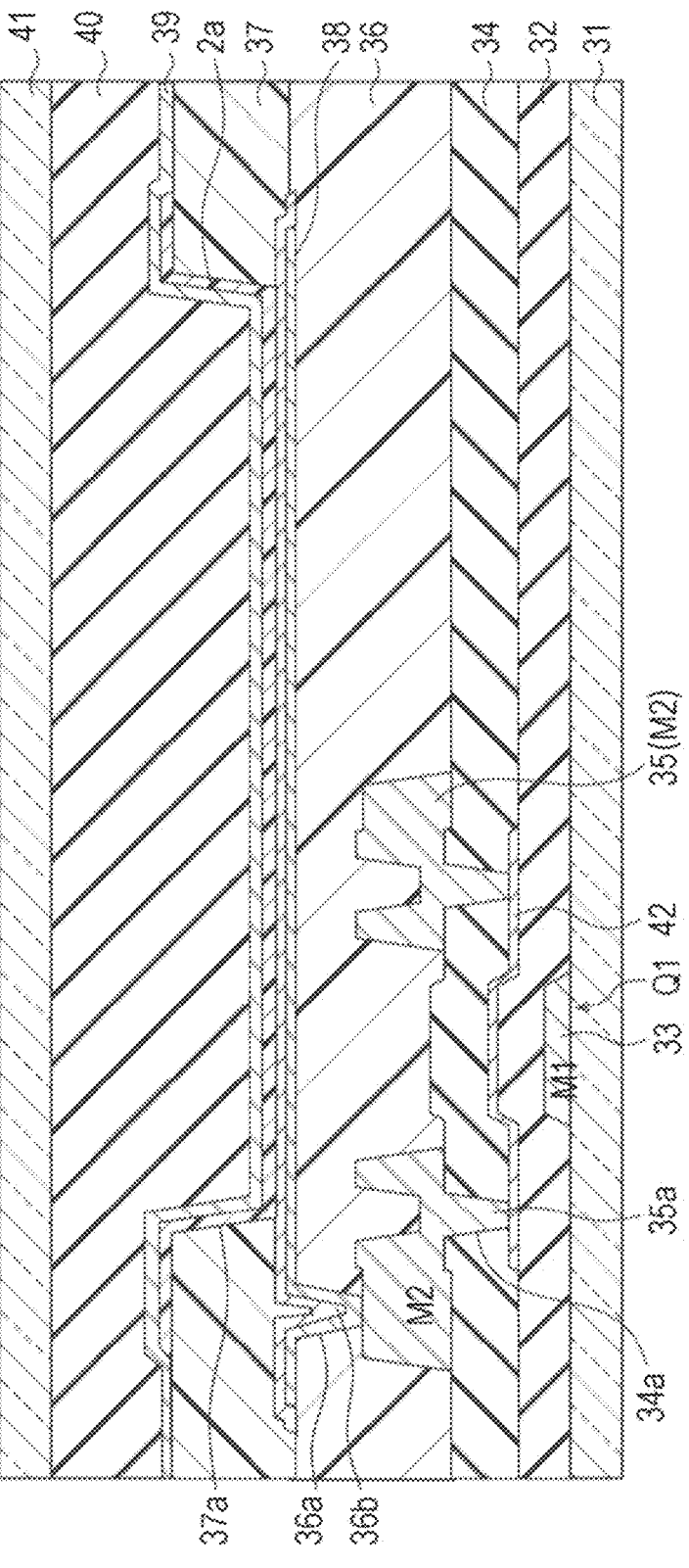
FIG. 9 is a cross-sectional view of the normal pixel in the third pixel region in which a sensor is not arranged immediately below.

FIG. 9 is a cross-sectional view of the normal pixel 7 (the color pixel 7) in the third pixel region 8 in which the sensor 5 is not arranged immediately below. FIG. 9 illustrates a cross-sectional structure in a direction of A-A line of FIG. 8, and more specifically illustrates a cross-sectional structure around the drive transistor Q1 in the pixel circuit 12. Note that the cross-sectional views illustrated in the drawings attached to the present specification, including FIG. 9, emphasize and illustrate a characteristic layer configuration, and a ratio of vertical and horizontal lengths does not necessarily coincide with a planar layout.

An upper surface in FIG. 9 is a display surface side of the display panel 2, and a bottom surface in FIG. 9 is a side on which the sensor 5 is arranged. From the bottom surface side to the upper surface side (a light emission side) in FIG. 9, a first transparent substrate 31, a first insulating layer 32, a first wiring layer (a gate electrode) 33, a second insulating layer 34, a second wiring layer (source wiring or drain wiring) 35, a third insulating layer 36, an anode electrode layer 38, a fourth insulating layer 37, a display layer 2*a*, a cathode electrode layer 39, a fifth insulating layer 40, and a second transparent substrate 41 are sequentially layered.

The first transparent substrate 31 and the second transparent substrate 41 are desirably formed by, for example, quartz glass, a transparent film, or the like having excellent visible light transmittance. Alternatively, either one of the first transparent substrate 31 and the second transparent substrate 41 may be made by quartz glass, and another one may be made by a transparent film.

Note that, from the viewpoint of production, a colored film having a relatively low transmittance, for example, a polyimide film may be used. Alternatively, at least one of the first transparent substrate 31 or the second transparent substrate 41 may be formed by a transparent film. On the first transparent substrate 31, the first wiring layer (M1) 33 for connection of each circuit element in the pixel circuit 12 is arranged. Alternatively, a protective layer On the first transparent substrate 31, the first insulating layer 32 is arranged so as to cover the first wiring layer 33. The first insulating layer 32 has, for example, a layered structure of a silicon nitride layer and a silicon oxide layer excellent in visible light transmittance. On the first insulating layer 32, a semiconductor layer 42 in which a channel region of each transistor in the pixel circuit 12 is formed is arranged. FIG. 9 schematically illustrates a cross-sectional structure of the drive transistor Q1 including a gate formed in the first wiring layer 33, a source and a drain formed in the second wiring layer 35, and a channel region formed in the semiconductor layer 42, but other transistors are also arranged in these layers 33, 35, and 42, and are connected to the first wiring layer 33 by contacts (not illustrated).

On the first insulating layer 32, the second insulating layer 34 is arranged so as to cover the transistor and the like. The second insulating layer 34 has, for example, a layered structure of a silicon oxide layer, a silicon nitride layer, and a silicon oxide layer having excellent visible light transmittance. A trench 34*a* is formed in a part of the second insulating layer 34, and the second wiring layer (M2) 35 connected to a source, a drain, and the like of each transistor is formed by filling a contact member 35*a* in the trench 34*a*. FIG. 9 illustrates the second wiring layer 35 for connection of the drive transistor Q1 and the anode electrode 12*a* of the OLED 20, but the second wiring layer 35 connected to other circuit elements is also arranged in the same layer. Furthermore, as described later, a third wiring layer (not illustrated in FIG. 9) may be provided between the second wiring layer 35 and the anode electrode 12*a*. The third wiring layer can be used as wiring in the pixel circuit 12, and may also be used for connection with the anode electrode 12*a*.

On the second insulating layer 34, the third insulating layer 36 that covers the second wiring layer 35 to planarize a surface is arranged. The third insulating layer 36 is formed by a resin material such as an acrylic resin. A film thickness of the third insulating layer 36 is made larger than a film thicknesses of the first to second insulating layers 32 and 34.

A trench 36*a* is formed on a part of an upper surface of the third insulating layer 36, a contact member 36*b* is filled in the trench 36*a* to achieve conduction with the second wiring layer 35, and the anode electrode layer 38 is formed by extending the contact member 36*b* to the upper surface side of the third insulating layer 36. The anode electrode layer 38 has a layered structure, and includes a metal material layer. The metal material layer generally has low visible light transmittance, and functions as a reflection layer that reflects light. As a specific metal material, for example, AlNd or Ag can be applied.

Since a lowermost layer of the anode electrode layer 38 is a portion in contact with the trench 36*a* and is easily disconnected, at least a corner portion of the trench 36*a* may be formed by a metal material such as AlNd, for example. An uppermost layer of the anode electrode layer 38 is formed by a transparent conductive layer such as indium tin oxide (ITO). Alternatively, the anode electrode layer 38 may have, for example, a layered structure of ITO/Ag/ITO. Ag is originally opaque, but the visible light transmittance is improved by reducing a film thickness. While strength is weakened when Ag is thinned, the anode electrode layer 38 can be made function as a transparent conductive layer by having the layered structure with ITO arranged on both surfaces.

On the third insulating layer 36, the fourth insulating layer 37 is arranged so as to cover the anode electrode layer 38. Similarly to the third insulating layer 36, the fourth insulating layer 37 is also formed by a resin material such as an acrylic resin. The fourth insulating layer 37 is patterned in accordance with an arrangement location of the OLED 20, and a recess 37*a* is formed.

Figure 10:
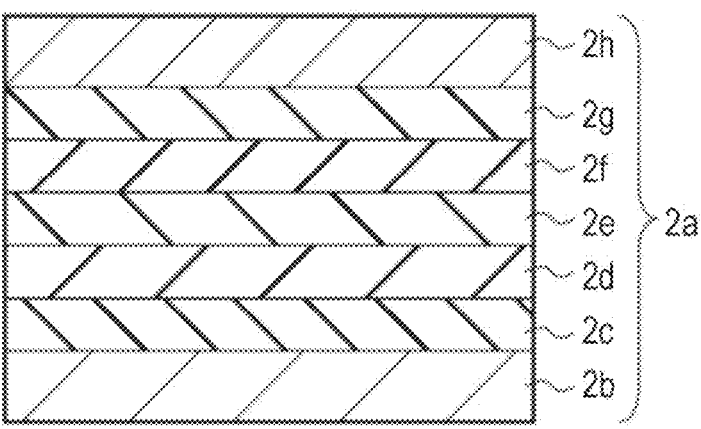
FIG. 10 is a cross-sectional view illustrating a cross-sectional structure of a display layer.

The display layer 2a is arranged so as to include a bottom surface and a side surface of the recess 37a of the fourth insulating layer 37. The display layer 2a has, for example, a layered structure as illustrated in FIG. 10. The display layer 2a illustrated in FIG. 10 has a layered structure in which an anode 2b, a hole injection layer 2c, a hole transport layer 2d, a light-emitting layer 2e, an electron transport layer 2f, an electron injection layer 2g, and a cathode 2h are arranged in a layering order from the anode electrode layer 38 side. The anode 2b is also referred to as the anode electrode 12a. The hole injection layer 2c is a layer into which positive holes from the anode electrode 12a are injected. The hole transport layer 2d is a layer that efficiently transports positive holes to the light-emitting layer 2e. The light-emitting layer 2e recombines positive holes and electrons to generate excitons, and emits light when the excitons return to a ground state. The cathode 2h is also referred to as a cathode electrode. The electron injection layer 2g is a layer into which electrons from the cathode 2h are injected. The electron transport layer 2f is a layer that efficiently transports electrons to the light-emitting layer 2e. The light-emitting layer 2e contains an organic substance.

The cathode electrode layer 39 is arranged on the display layer 2a illustrated in FIG. 9. The cathode electrode layer 39 is formed by a transparent conductive layer similarly to the anode electrode layer 38. Note that, the transparent conductive layer of the anode electrode layer 38 is formed by, for example, ITO/Ag/ITO, and the transparent electrode layer of the cathode electrode layer 39 is formed by, for example, MgAg (which becomes a semi-transparent electrode by thinning) having a film thickness of several nm to several tens of nm or indium zinc oxide (IZO; a transparent electrode) having a film thickness of several tens of nm to several hundreds of nm.

The fifth insulating layer 40 is arranged on the cathode electrode layer 39. The fifth insulating layer 40 planarizes an upper surface and is formed by an insulating material excellent in moisture resistance. The second transparent substrate 41 is arranged on the fifth insulating layer 40.

As illustrated in FIGS. 8 and 9, in the third pixel region 8, the anode electrode layer 38 functioning as a reflective film is arranged in substantially the entire region of the color pixel 7, and visible light cannot be transmitted.

Figure 11:
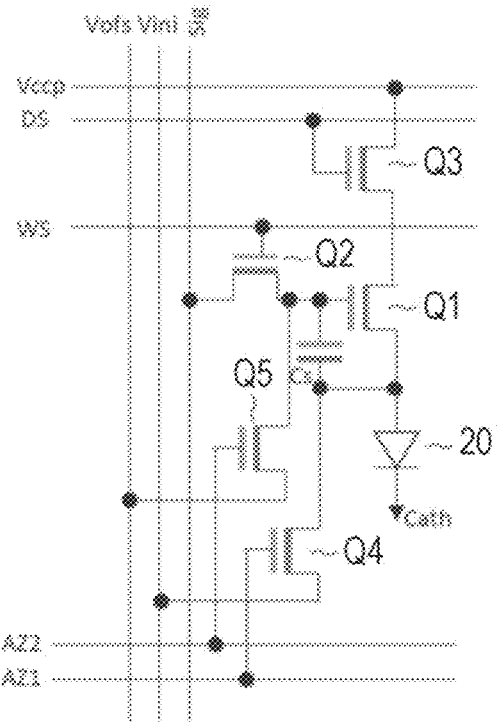
FIG. 11 is a circuit diagram of a pixel circuit including five transistors.

Although the pixel circuit 12 in FIG. 7 includes two transistors, various modifications are conceivable for a specific circuit configuration of the pixel circuit 12. FIG. 11 is a circuit diagram of the pixel circuit 12 including five transistors Q1 to Q5. In addition to the OLED 20, the pixel circuit 12 of FIG. 11 includes the drive transistor Q1, the sampling transistor Q2, a power supply transistor Q3, a first control transistor Q4, a second control transistor Q5, and the pixel capacitance Cs.

The power supply transistor Q3 and the drive transistor Q1 are cascode-connected between the power supply voltage Vccp and the anode of the OLED 20. The sampling transistor Q2 is connected between the gate of the drive transistor Q1 and the signal line Sig. The pixel capacitance Cs is connected between the gate of the drive transistor Q1 and the anode of the OLED 20. The first control transistor Q4 is connected between the anode of the OLED 20 and an initialization voltage Vini node. To a gate of the first control transistor Q4, a first control signal line AZ1 is connected. The second control transistor Q5 is connected between the gate of the drive transistor Q1 and an offset voltage Vofs node. To a gate of the second control transistor Q5, a second control signal line AZ2 is connected.

Figure 12:
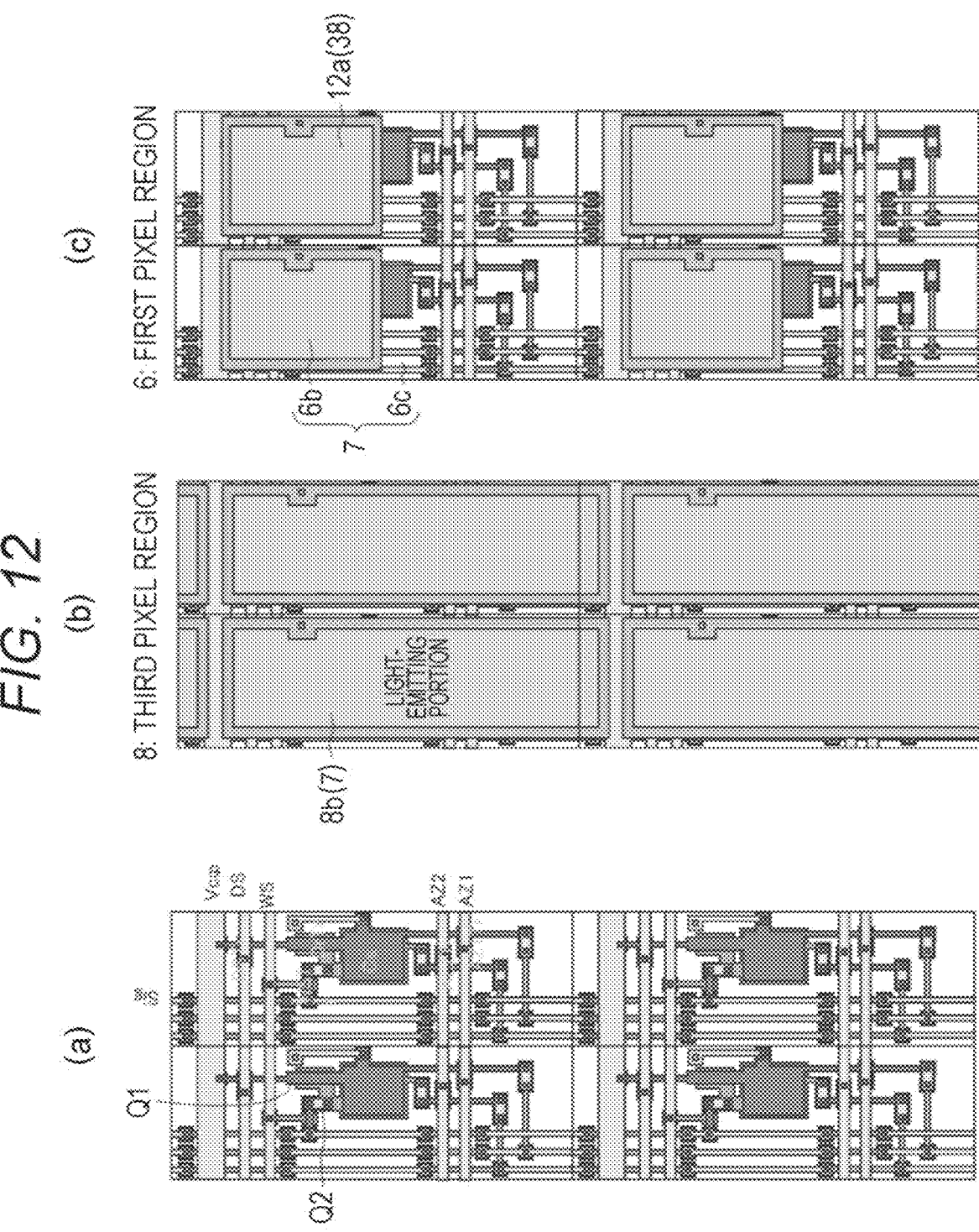
FIGS. 12(a), 12(b), and 12(c) are layout views of pixels in a display panel including the pixel circuit of FIG. 11.

FIG. 12 is a layout view of the pixels 7 in the display panel 2 including the pixel circuit 12 in FIG. 11. FIG. 12 illustrates a planar layout of a total of four color pixels 7 including two color pixels 7 horizontally and two color pixels 7 vertically. FIG. 12(a) is a layout view of the pixel circuit 12 arranged below the anode electrode 12a of the color pixel 7, FIG. 12(b) is a layout view of the third pixel region 8 not overlapping with the sensor 5, and FIG. 12(c) is a layout view of the first pixel region 6 overlapping with the sensor 5.

As can be seen from comparison between FIG. 12(a) and FIG. 8(a), since the pixel circuit 12 of FIG. 11 has a more complicated circuit configuration than the pixel circuit 12 of FIG. 7, a wiring pattern and the like in the pixel circuit 12 are arranged over substantially the entire region in the color pixel 7.

The layout of the normal pixels (the color pixels) 7 in the third pixel region 8 illustrated in FIG. 12(b) is substantially similar to that of FIG. 8(b), and substantially the entire region of the color pixels 7 functions as the third light emitting region 8b. The transmissive pixel (the color pixel) 7 in the first pixel region 6 illustrated in FIG. 12(c) includes the first light emitting region 6b and the first non-light emitting region 6c similarly to FIG. 8(c). However, in FIG. 8(c), a wiring pattern and the like of the pixel circuit 12 are not arranged in the first non-light emitting region 6c, whereas in FIG. 12(c), a wiring pattern and the like of the pixel circuit 12 are arranged in the first non-light emitting region 6c. Even if the wiring pattern and the like of the pixel circuit 12 are arranged in the first non-light emitting region 6c, visible light can be transmitted through a gap of the wiring pattern and the like, so that the first non-light emitting region 6c functions as the transmissive window 6d that allows light to be incident on the sensor 5.

As described above, in a case where the sensor 5 is arranged immediately below the display panel 2, and the first pixel region 6 as illustrated in FIG. 3 is provided at a position overlapping with the sensor 5 in the display panel 2, the first light emitting region 6b of each pixel 7 in the first pixel region 6 has a smaller area than the third light emitting region 8b of each normal pixel 7 in the third pixel region 8. Therefore, a current per unit area in the first light emitting region 6b is larger than a current per unit area in the third light emitting region 8b, and deterioration, that is, burn-in easily occurs.

Figure 13:
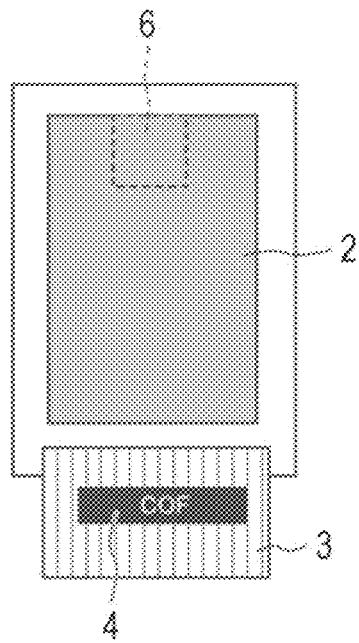
FIG. 13 is an external view schematically illustrating a display panel in which burn-in has not occurred.
Figure 14:
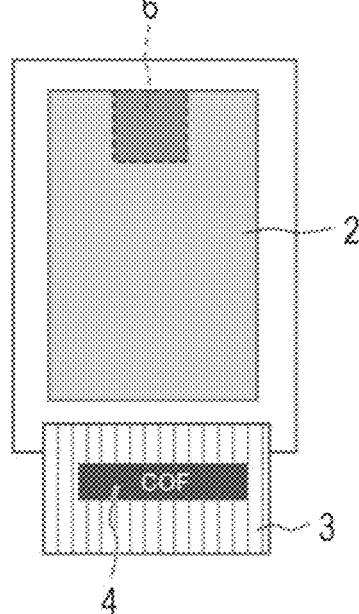
FIG. 14 is an external view schematically illustrating a display panel in which burn-in has occurred.

FIG. 13 is an external view schematically illustrating the display panel 2 in which burn-in has not occurred, and FIG. 14 is an external view schematically illustrating the display panel 2 in which burn-in has occurred. A broken line portion in FIGS. 13 and 14 is the first pixel region 6 in which the sensor 5 is arranged immediately below. When burn-in occurs, as illustrated in FIG. 14, luminance of the first pixel region 6 becomes lower than that of the surrounding third pixel region 8, and display quality of the display panel 2 is deteriorated. Such burn-in is likely to occur in a pixel region where a current per unit area is large.

Figure 15A:
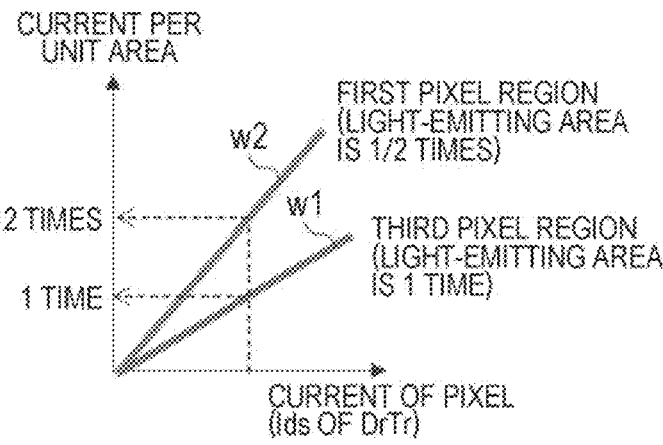
FIG. 15A is a view illustrating current characteristics of each pixel in the display panel in which burn-in has not occurred in FIG. 13.
Figure 15B:
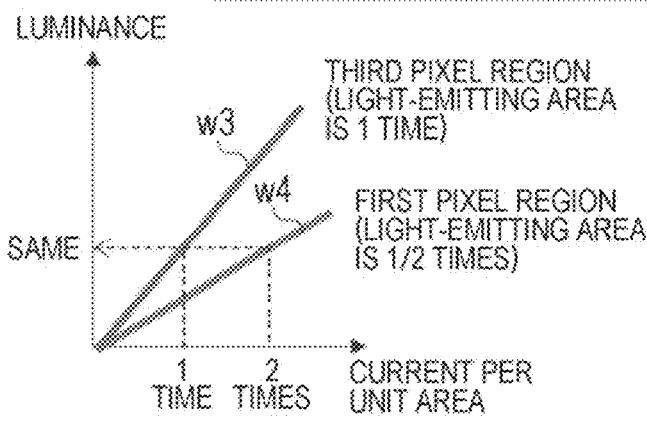
FIG. 15B is a view illustrating element characteristics of an OLED in the display panel in FIG. 13.

FIG. 15A is a view illustrating current characteristics of each pixel 7 in the display panel 2 in which burn-in has not occurred in FIG. 13. Furthermore, FIG. 15B is a view illustrating element characteristics of the OLED 20 in the display panel 2 in FIG. 13. In FIG. 15A, a horizontal axis represents a current flowing through the pixel 7, and a vertical axis represents a current per unit area. Furthermore, in FIG. 15B, a horizontal axis represents a current per unit area, and a vertical axis represents luminance of the display panel 2. FIGS. 15A and 15B illustrate an example in which an area of the first pixel region 6 is made half an area of the third pixel region 8.

A waveform w1 in FIG. 15A indicates a current characteristic of the normal pixel 7 in the third pixel region 8 not overlapping with the sensor 5, and a waveform w2 indicates a current characteristic of the transmissive pixel 7 in the first pixel region 6 overlapping with the sensor 5. A light-emitting area of the transmissive pixel 7 in the first pixel region 6 overlapping with the sensor 5 is half that of the normal pixel 7 in the third pixel region 8, but a current flowing through the entire pixel 7 does not change, so that a current per unit area is to be 2 times.

A waveform w3 in FIG. 15B indicates an element characteristic of the OLED 20 in the third pixel region 8 not overlapping with the sensor 5, and a waveform w4 indicates an element characteristic of the OLED 20 in the first pixel region 6 overlapping with the sensor 5. A light-emitting area of the transmissive pixel 7 in the first pixel region 6 overlapping with the sensor 5 is half that of the normal pixel 7 in the third pixel region 8, but a current per unit area is twice that of the normal pixel 7 in the third pixel region 8. Therefore, luminance is the same in a state in which deterioration does not occur.

Figure 16A:
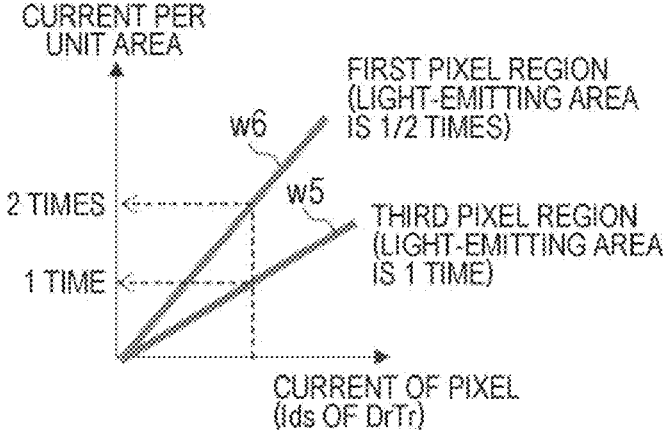
FIG. 16A is a view illustrating current characteristics of each pixel in the display panel in which burn-in has occurred in FIG. 14.
Figure 16B:
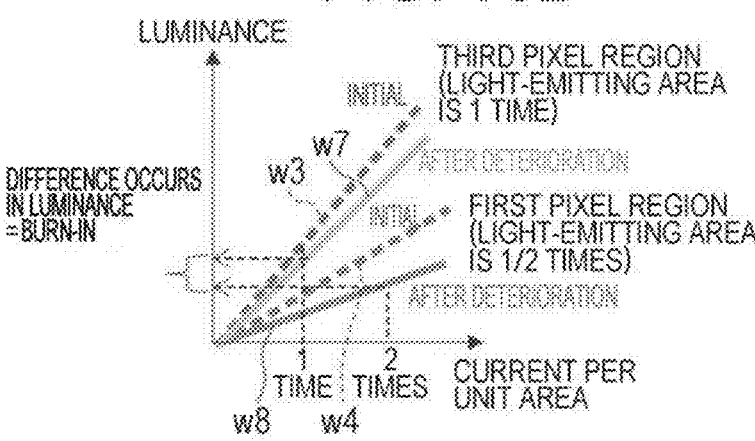
FIG. 16B is a view illustrating element characteristics of an OLED in the display panel in FIG. 14.

FIG. 16A is a view illustrating current characteristics of each pixel 7 in the display panel 2 in which burn-in has occurred in FIG. 14. Furthermore, FIG. 16B is a view illustrating element characteristics of the OLED 20 in the display panel 2 in FIG. 14. In FIG. 16A, a horizontal axis represents a current flowing through the pixel 7, and a vertical axis represents a current per unit area. Furthermore, in FIG. 16B, a horizontal axis represents a current per unit area, and a vertical axis represents luminance of the display panel 2. FIGS. 16A and 16B illustrate an example in which an area of the first pixel region 6 is made half an area of the third pixel region 8.

A waveform w5 in FIG. 16A indicates a current characteristic of the normal pixel 7 in the third pixel region 8 not overlapping with the sensor 5, and a waveform w6 indicates a current characteristic of the transmissive pixel 7 in the first pixel region 6 overlapping with the sensor 5. A light-emitting area of the transmissive pixel 7 in the first pixel region 6 overlapping with the sensor 5 is half that of the normal pixel 7 in the third pixel region 8, but a current flowing through the entire pixel 7 does not change, so that a current per unit area is to be 2 times similarly to FIG. 15A.

A waveform w7 in FIG. 16B indicates an element characteristic of the OLED 20 after deterioration in the third pixel region 8 not overlapping with the sensor 5, and a waveform w8 indicates an element characteristic of the OLED 20 after deterioration in the first pixel region 6 overlapping with the sensor 5. The waveform w7 has a gentler inclination than the waveform w3. Similarly, the waveform w8 has a gentler inclination than the waveform w4. The reason why the inclinations of the waveforms w7 and w8 become gentle is that the pixel 7 is deteriorated, that is, burn-in has occurred, and luminance decreases even if the same current flows through the OLED 20. Note that, when the inclinations of the waveforms w7 and w8 are compared with each other, a degree of becoming gentle is larger in the inclination of the waveform w8. This is because, under a condition that luminance of the pixel 7 is the same, as the light-emitting area in the pixel 7 is smaller, the current per unit area increases, that is, burn-in, of the OLED 20 is further promoted, and the luminance further decreases.

In this way, the pixel 7 having a large current per unit area is more likely to deteriorate than the pixel 7 having a small current per unit area. For this reason, in the pixel 7 in which the light-emitting area is reduced due to provision of the transmissive window 6d in the pixel 7, deterioration is likely to occur, so that luminance decrease is likely to occur. When only a part of the pixel region in the display panel 2 has luminance decrease, display quality is deteriorated. Therefore, in the image display device 1 according to the first embodiment described below, a countermeasure is taken such that luminance decrease due to deterioration is unnoticeable.

First Embodiment

Figure 17:
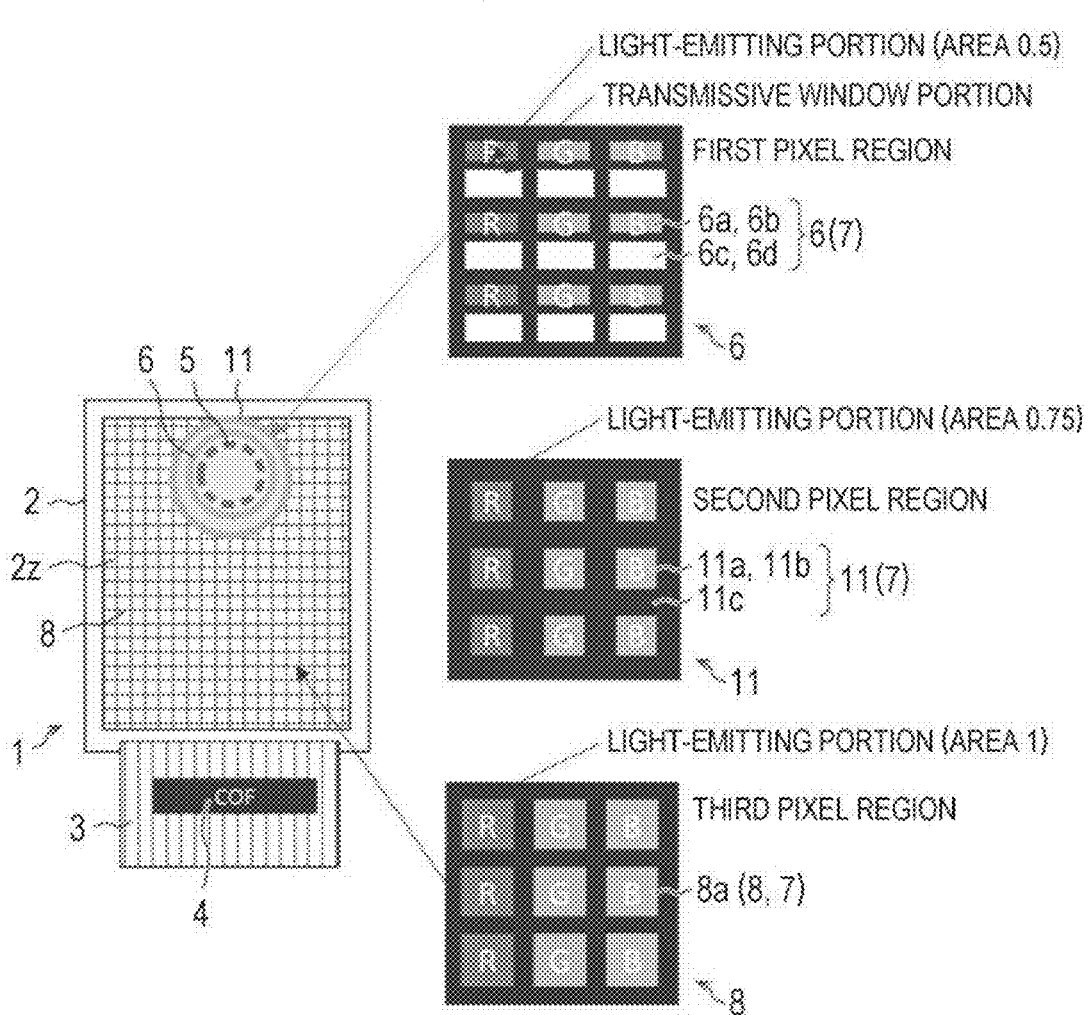
FIG. 17 is a view schematically illustrating a structure of a pixel in the image display device according to the first embodiment.

FIG. 17 is a view schematically illustrating a structure of the pixel 7 in the image display device 1 according to the first embodiment. The sensor 5 such as the image sensor module 9 is arranged immediately below the display panel 2 in the image display device 1 according to the present embodiment. The display panel 2 includes the first pixel region 6, a second pixel region 11, and the third pixel region 8. The first pixel region 6 includes the pixels (the transmissive pixels) 7 that emit light and transmit visible light. The second pixel region 11 includes the pixels 7 that are arranged around the first pixel region 6 and emit light with an area larger than a light-emitting area of the first pixel region 6. The third pixel region 8 includes the pixels (the normal pixels) 7 that are arranged around the second pixel region 11 and emit light with an area larger than a light-emitting area of the second pixel region 11.

The light-emitting areas of the first to third pixel regions 6, 11, and 8 increase in the order of the first pixel region 6, the second pixel region 11, and the third pixel region 8. The first pixel region 6 is arranged immediately above the sensor 5. The second pixel region 11 is arranged outside the first pixel region 6 from a position in contact with the first pixel region 6. The third pixel region 8 is arranged outside from a position in contact with the second pixel region 11. In a case where the first to third pixel regions 6, 11, and 8 are concentric circles, an outer diameter of the second pixel region 11 is larger than an outer diameter of the first pixel region 6, and the third pixel region 8 is arranged outside an outer peripheral edge of the second pixel region 11. Note that outer shapes of the first to third pixel regions 6, 11, and 8 may be any shape, but an example of being circular or rectangular will be mainly described in the present specification. The second pixel region 11 may include a plurality of pixels having a light-emitting area that decreases continuously or stepwise from a predetermined light-emitting area.

A broken line in FIG. 17 indicates an outer peripheral edge of the sensor 5. In the example of FIG. 17, the first pixel region 6 is provided within a range having the same diameter as or a slightly larger diameter than the outer peripheral edge of the sensor 5. Furthermore, the second pixel region 11 is provided in a range from an outer peripheral edge of the first pixel region 6 to an outer peripheral edge that is concentric with the first pixel region 6 and is larger than the first pixel region 6. Furthermore, the third pixel region 8 is provided outside from a position in contact with the second pixel region 11.

Figure 18A:
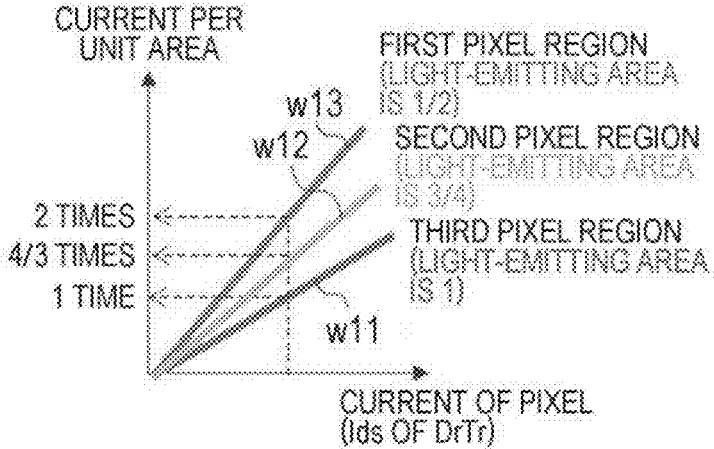
FIG. 18A is a view illustrating current characteristics of a pixel in a display panel in FIG. 17.
Figure 18B:
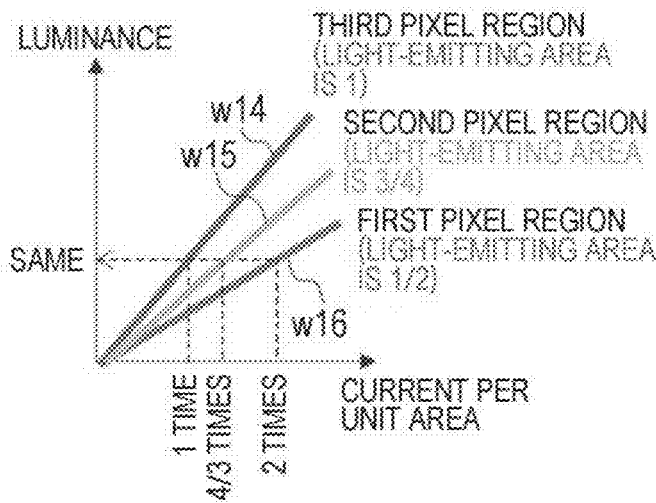
FIG. 18B is a view illustrating element characteristics of an OLED in the display panel 2 in FIG. 17.

FIG. 18A is a view illustrating current characteristics of the pixel 7 in the display panel 2 in FIG. 17, and FIG. 18B is a view illustrating element characteristics of the OLED 20 in the display panel 2 in FIG. 17. In FIG. 18A, a horizontal axis represents a current of the pixel 7, and a vertical axis represents a current per unit area. In FIG. 18B, a horizontal axis represents a current per unit area, and a vertical axis represents luminance of the display panel 2.

As a specific example, in FIGS. 18A and 18B, a light-emitting area of the third pixel region 8 is set to 1, a light-emitting area of the second pixel region 11 is set to ¾, and a light-emitting area of the third pixel region 8 is set to ½. In FIG. 18A, a waveform w11 indicates a current characteristic of the normal pixel 7 in the third pixel region 8, a waveform w12 indicates a current characteristic of the pixel 7 in the second pixel region 11, and a waveform w13 indicates a current characteristic of the transmissive pixel 7 in the first pixel region 6. As can be seen from the waveforms w11 to w13, when a current per unit area in the third pixel region 8 is assumed to be 1 time, a current per unit area in the second pixel region 11 is 4/3 times, and a current per unit area in the third pixel region 8 is 2 times.

In FIG. 18B, a waveform w14 indicates an element characteristic of the OLED 20 in the third pixel region 8, a waveform w15 indicates an element characteristic of the OLED 20 in the second pixel region 11, and a waveform w16 indicates an element characteristic of the OLED 20 in the first pixel region 6. As indicated by the waveform w14, the third pixel region 8 has a light-emitting area of 1 and a current per unit area of 1 time. Furthermore, as indicated by the waveform w15, the second pixel region 11 has a light-emitting area of ¾ and a current per unit area of 4/3 times. Furthermore, as indicated by the waveform w16, the first pixel region 6 has a light-emitting area of ½ and a current per unit area of 2 times. Therefore, the luminance of the first to third pixel regions 6, 11, and 8 is equal.

Figure 19:
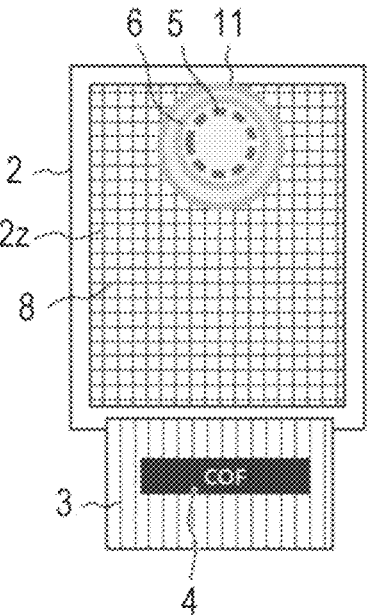
FIG. 19 is a schematic external view of the display panel in the image display device according to the first embodiment.
Figure 20:
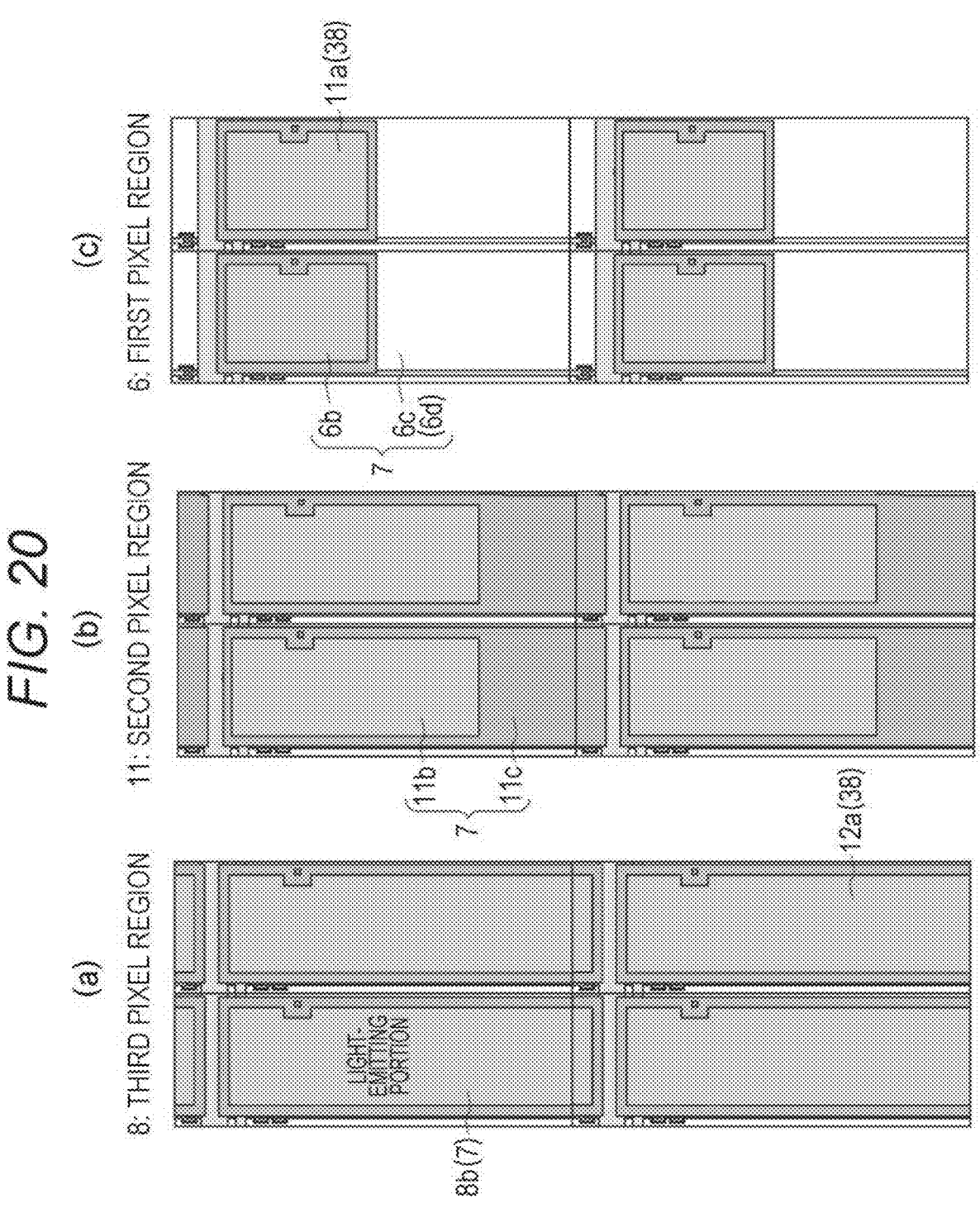
FIGS. 20(*a*), 20(*b*), and 20(*c*) are planar layout views of the display panel in FIG. 19.

FIG. 19 is a schematic external view of the display panel 2 in the image display device 1 according to the first embodiment, and FIG. 20 is a planar layout view of the display panel 2 in FIG. 19. The display panel 2 in FIG. 19 includes the first pixel region 6, the second pixel region 11, and the third pixel region 8. Although one sensor 5 is arranged immediately below the display panel 2 in FIG. 19, a plurality of sensors 5 may be arranged immediately below the display panel 2 as illustrated in FIG. 2A or 2B. All of the outer peripheral edge of the sensor 5 and the outer peripheral edge of each of the first to third pixel regions 6, 11, and 8 have a circular shape having a common center position. An outer diameter of the first pixel region 6 is larger than an outer diameter of the sensor 5, an outer diameter of the second pixel region 11 is larger than the outer diameter of the first pixel region 6, and the third pixel region 8 is arranged outside an outer peripheral edge of the second pixel region 11.

FIG. 20(*a*) illustrates a planar layout of each pixel 7 in the third pixel region 8. Almost the entire region of each normal pixel 7 in the third pixel region 8 is the third light emitting region 8*b*.

FIG. 20(*b*) illustrates a planar layout of each pixel 7 in the second pixel region 11. The pixel 7 in the second pixel region 11 includes a second self light-emitting element 11*a*, a second light emitting region 11*b*, and a second non-light emitting region 11*c*. The second light emitting region 11*b* is smaller than an area of the third light emitting region 8*b* in the third pixel region 8, and larger than an area of the first light emitting region 6*b* in the first pixel region 6. The second non-light emitting region 11*c* in the second pixel region 11 is a region that does not include the transmissive window 6*d*, and cannot transmit visible light.

FIG. 20(*c*) illustrates a planar layout of each transmissive pixel 7 in the first pixel region 6. The transmissive pixel 7 in the first pixel region 6 includes a first self light-emitting element 6*a*, the first light emitting region 6*b*, and the first non-light emitting region 6*c*. An area of the first light emitting region 6*b* is smaller than areas of the second light emitting region 11*b* in the second pixel region 11 and the third light emitting region in the third pixel region 8. The first non-light emitting region 6*c* is provided with the transmissive window 6*d*, and can transmit visible light. In the example of FIG. 20(*c*), a wiring pattern and the like of the pixel circuit 12 are not arranged in a portion of the transmissive window 6*d*. Therefore, light incident on the transmissive window 6*d* is incident on the sensor 5 without being blocked by the pixel circuit 12.

Figure 21:
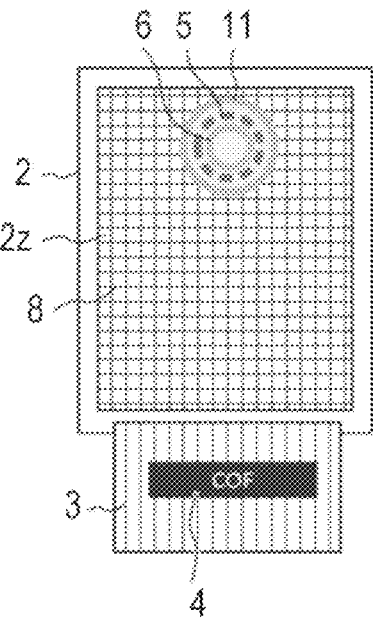
FIG. 21 is a plan view of a first modification of the display panel according to the first embodiment.
Figure 22:
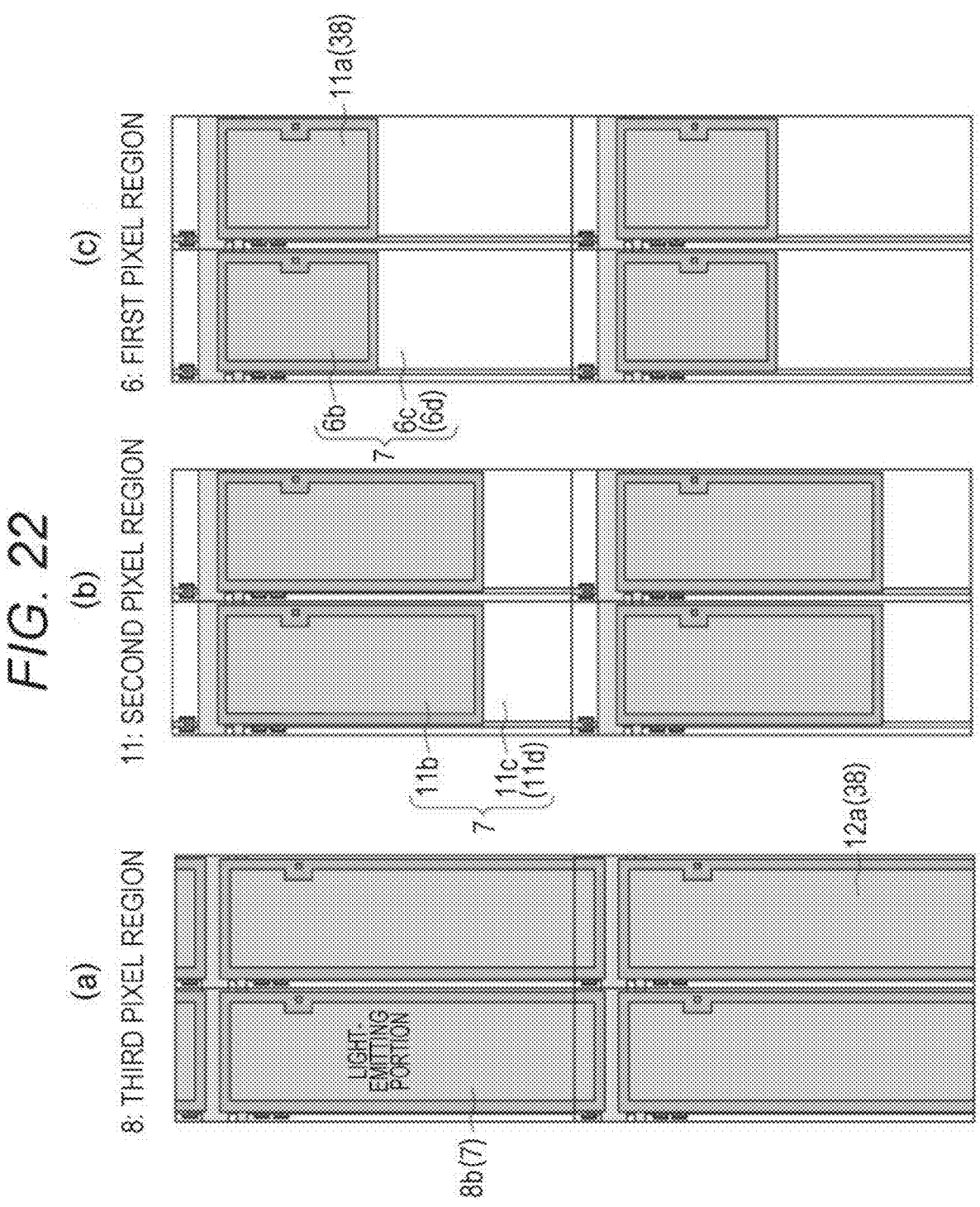
FIGS. 22(*a*), 22(*b*), and 22(*c*) are planar layout views of the first modification.

FIGS. 19 and 20 are examples of the display panel 2, and various modifications are conceivable. FIG. 21 is a plan view of a first modification of the display panel 2 according to the first embodiment, and FIG. 22 is a planar layout view of the first modification.

FIG. 21 is different from FIG. 19 in that an outer diameter of the sensor 5 is larger than an outer diameter of the first pixel region 6. That is, in FIG. 21, an outer diameter of the sensor 5 is larger than an outer diameter of the first pixel region 6, an outer diameter of the second pixel region 11 is larger than the outer diameter of the sensor 5, and the third pixel region 8 is arranged outside the outer peripheral edge of the second pixel region 11.

In the case of FIG. 21, since the outer diameter of the sensor 5 is larger than the outer diameter of the first pixel region 6, if the second pixel region 11 does not transmit light, there is a possibility that a part of light from a range of an angle of view of the sensor 5 is not incident on the sensor 5. Therefore, as illustrated in FIG. 22(*b*), a transmissive window (a second transmissive window) 11*d* is provided in the second non-light emitting region 11*c* in the second pixel region 11, to transmit light. This point is different from FIG. 20(*b*). The first pixel region 6 of FIG. 22(*a*) and the third pixel region 8 of FIG. 22(*c*) have a structure similar to the first pixel region 6 of FIG. 20(*a*) and the third pixel region 8 of FIG. 20(*c*).

Figure 23:
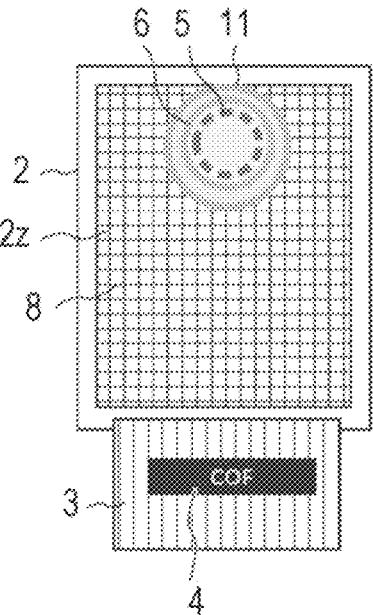
FIG. 23 is a plan view of a second modification of the display panel according to the first embodiment.
Figure 24:
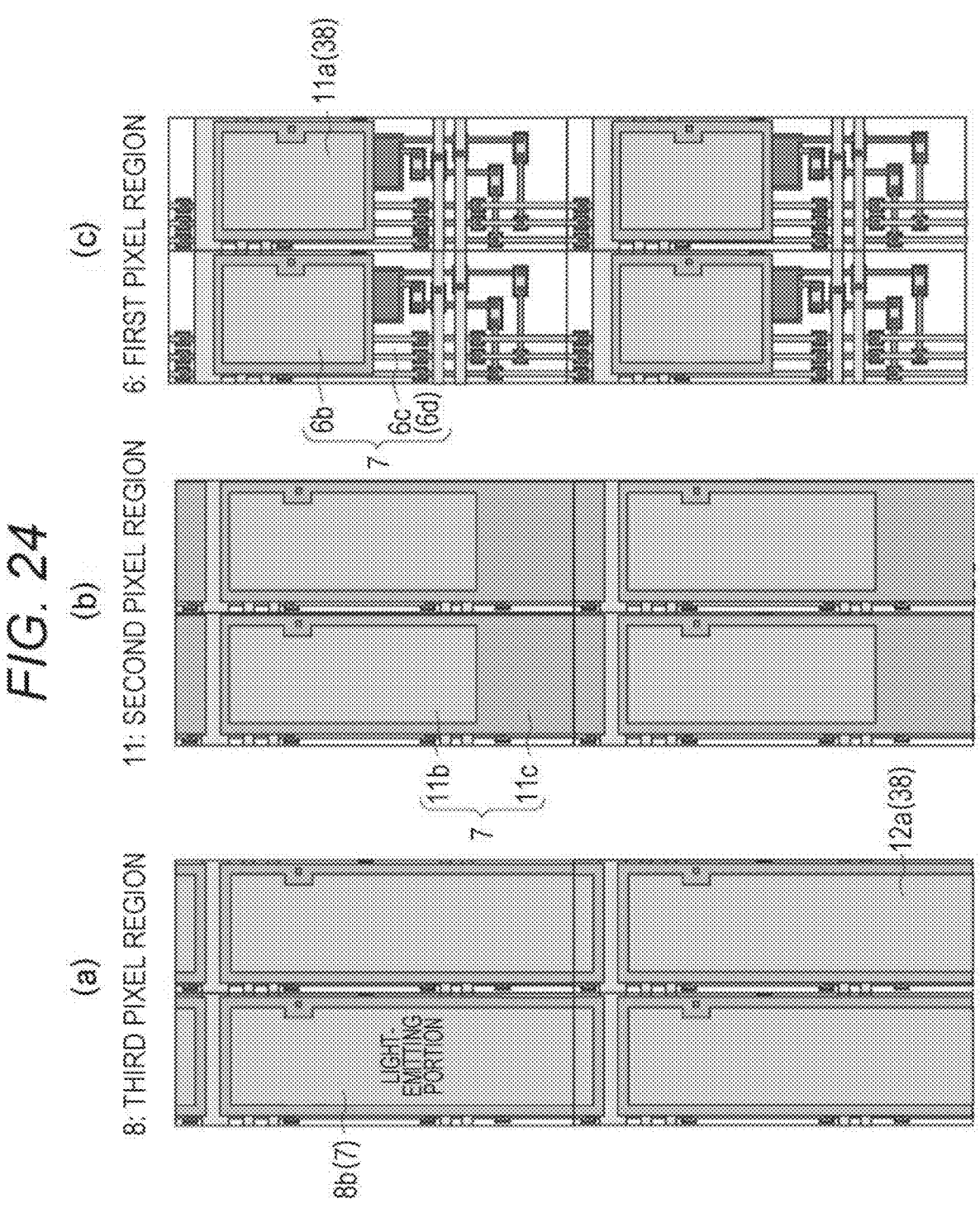
FIGS. 24(*a*), 24(*b*), and 24(*c*) are planar layout views of the second modification.

FIG. 23 is a plan view of a second modification of the display panel 2 according to the first embodiment, and FIG. 24 is a planar layout view of the second modification. In the second modification, similarly to FIG. 19, an outer diameter of the first pixel region 6 is larger than an outer diameter of the sensor 5, an outer diameter of the second pixel region 11 is larger than the outer diameter of the first pixel region 6, and the third pixel region 8 is arranged outside the outer peripheral edge of the second pixel region 11. In the second modification, as illustrated in FIG. 24(*a*), the transmissive window 6*d* is provided in the first non-light emitting region 6*c* in the first pixel region 6. However, there is a difference from FIG. 20(*a*) in that a wiring pattern and the like of the pixel circuit 12 are arranged in the transmissive window 6*d*. In the second modification, the wiring pattern and the like of the pixel circuit 12 are arranged in the transmissive window 6*d* in the first pixel region 6 located immediately above the sensor 5, and an amount of light incident on the sensor 5 is smaller than that of the display panel 2 in FIG. 19, but the sensor 5 can be operated normally.

Figure 25:
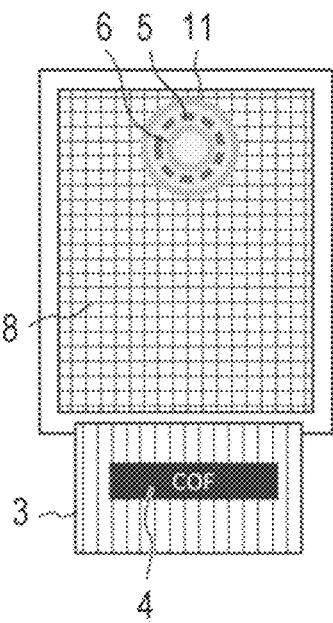
FIG. 25 is a plan view of a third modification of the display panel according to the first embodiment.
Figure 26:
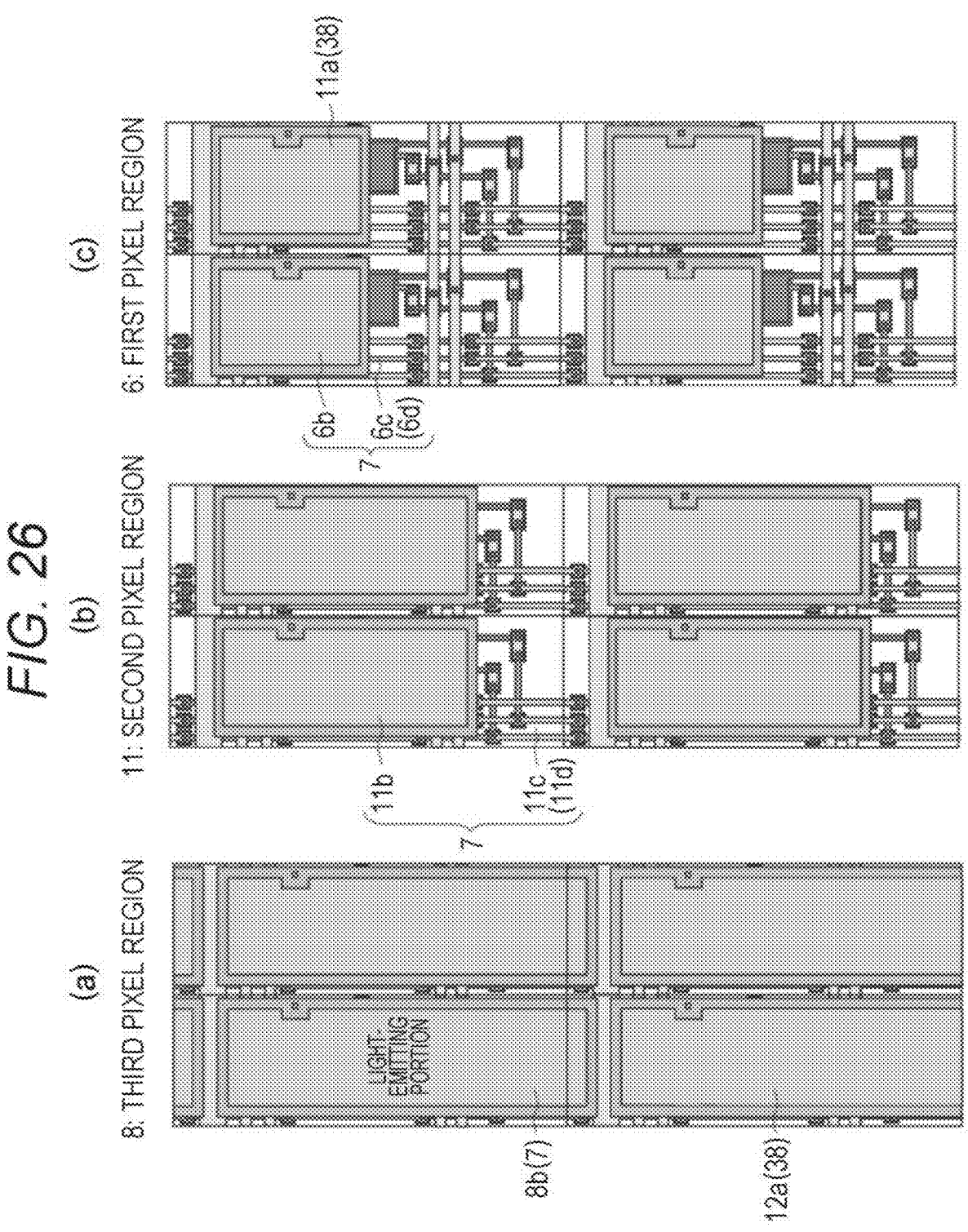
FIGS. 26(*a*), 26(*b*), and 26(*c*) are planar layout views of the third modification.

FIG. 25 is a plan view of a third modification of the display panel 2 according to the first embodiment, and FIG. 26 is a planar layout view of the third modification. In the third modification, similarly to FIG. 21, an outer diameter of the sensor 5 is larger than an outer diameter of the first pixel region 6, an outer diameter of the second pixel region 11 is larger than the outer diameter of the sensor 5, and the third pixel region 8 is arranged outside the outer peripheral edge of the second pixel region 11. In the third modification, as illustrated in FIG. 26(*a*), the transmissive window 6*d* is provided in the second non-light emitting region 11c in the first pixel region 6, and as illustrated in FIG. 26(b), the transmissive window 11d is also provided in the second non-light emitting region 11c in the second pixel region 11. There is a difference from the first pixel region 6 of FIG. 22(a) and the second pixel region 11 of FIG. 22(b) in that a wiring pattern and the like of the pixel circuit 12 are arranged in the transmissive windows 6d and 11d. In the display panel 2 of FIG. 25, since the wiring pattern and the like exist in the transmissive windows 6d and 11d, an amount of incident light of the sensor 5 is smaller than that of the display panel 2 of FIG. 21, but the sensor 5 can be operated normally.

(Pixel Arrangement)

As illustrated in FIG. 17, in the present embodiment, the first to third pixel regions 6, 11, and 8 are provided in the display panel 2. The first pixel region 6 is a region overlapping with the sensor 5, the second pixel region 11 is a region arranged outside the first pixel region 6 to be in contact with the first pixel region 6, and the third pixel region 8 is a region arranged outside the second pixel region 11 to be in contact with the second pixel region 11. There may be a plurality of pixel arrangements in the first to third pixel regions 6, 11, and 8. Hereinafter, representative pixel arrangements will be sequentially described.

Figure 27:
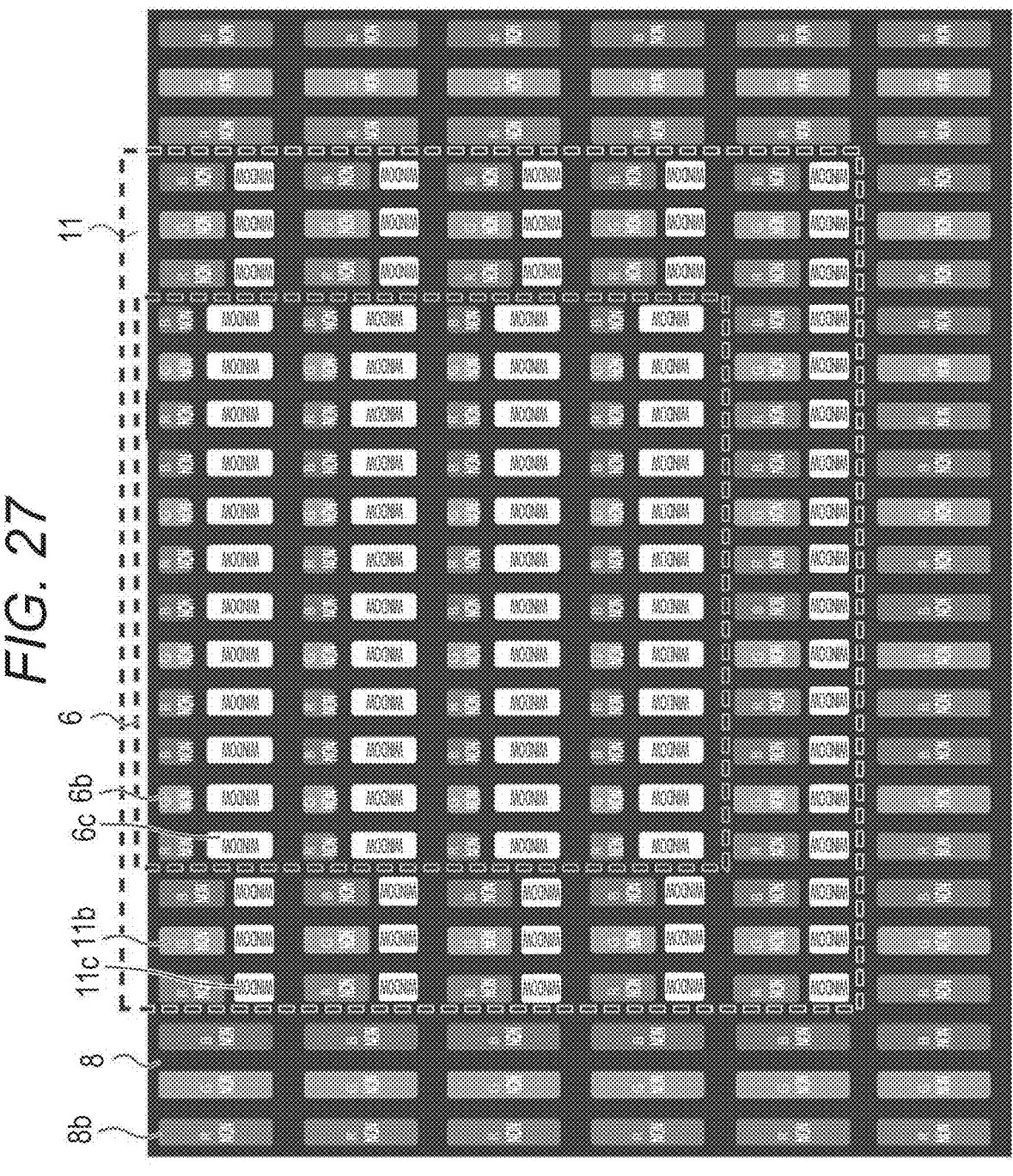
FIG. 27 is a view illustrating a first example of pixel arrangement in first to third pixel regions.

FIG. 27 is a view illustrating a first example of pixel arrangement in the first to third pixel regions 6, 11, and 8. FIG. 27 illustrates an example in which the first and second pixel regions 6 and 11 are formed in a rectangular shape, but shapes of the first to third pixel regions 6, 11, and 8 may be any shape, and may be circular as illustrated in FIG. 19 and the like. The second pixel region 11 is arranged outside an outer edge portion of the first pixel region 6 with the same pixel width vertically and horizontally.

Each pixel 7 in the first pixel region 6 in FIG. 27 includes the first light emitting region 6b and the first non-light emitting region 6c. In FIG. 27, since the first light emitting region 6b does not transmit light, "Non" is written. Furthermore, since the first non-light emitting region 6c in the first pixel region 6 includes the transmissive window 6d, "Window" is written. Since the first pixel region 6 is generally located immediately above the sensor 5, each pixel 7 in the first pixel region 6 includes the transmissive window 6d of the same size.

As illustrated in FIG. 27, the second pixel region 11 having a predetermined pixel width is arranged outside the outer edge portion of the first pixel region 6. The second pixel region 11 includes the second light emitting region 11b and the second non-light emitting region 11c. A light-emitting area of the second light emitting region 11b in the second pixel region 11 is made larger than a light-emitting area of the first light emitting region 6b in the first pixel region 6. In the example of FIG. 27, the second non-light emitting region 11c in the second pixel region 11 includes the transmissive window 11d. The transmissive window 11d is smaller in size than the transmissive window 6d. Light transmitted through the transmissive window 11d in the second pixel region 11 can be incident on the sensor 5. Note that, providing the transmissive window 11d in the second non-light emitting region 11c in the second pixel region 11 is not essential. As in the second pixel region 11 in FIG. 20(b), the transmissive window 11d may not be provided.

As illustrated in FIG. 27, the third pixel region 8 is arranged outside an outer edge portion of the second light emitting region 11b. The third pixel region 8 is arranged in the entire region except for the first pixel region 6 and the second pixel region 11 in the display panel 2. Each pixel (normal pixel) 7 in the third pixel region 8 includes the third light emitting region 8b, but does not include a non-light emitting region. Therefore, each pixel 7 in the third pixel region 8 emits light in substantially the entire region in each pixel 7.

As can be seen from FIG. 27, a light-emitting area of each pixel 7 in the first to third pixel regions 6, 11, and 8 decreases in the order of the third pixel region 8, the second pixel region 11, and the first pixel region 6. In a state where burn-in has not occurred in the display panel 2, each of the pixels 7 in the first to third pixel regions 6, 11, and 8 emits light with substantially the same luminance by making currents per unit area different, but luminance of a pixel region having a smaller light-emitting area decreases as the deterioration progresses. Specifically, luminance of each pixel 7 in the first pixel region 6 having the smallest light-emitting area has the largest decrease, and there is a possibility that a difference from luminance of each pixel 7 in the third pixel region 8 is visually recognized by human eyes. However, in FIG. 27, the second pixel region 11 is arranged between the first pixel region 6 and the third pixel region 8, and the light-emitting area of each pixel 7 in the second pixel region 11 is made larger than the light-emitting area of each pixel 7 in the first pixel region 6 and smaller than the light-emitting area of each pixel 7 in the third pixel region 8. Therefore, luminance decrease due to deterioration in the second pixel region 11 is smaller than luminance decrease due to deterioration in the first pixel region 6. Therefore, providing the second pixel region 11 causes the luminance to decrease stepwise, and luminance decrease due to deterioration of the first pixel region 6 in the entire region of the display panel 2 becomes less noticeable. Note that, in a case where priority is given to an aperture ratio in consideration of layout efficiency of elements, wiring, and anodes in the pixel, as illustrated in FIG. 27, the light emitting regions in the pixel regions 6 and 11 have a layout in which, for example, an upper side is biased in the pixel. However, in order to match a barycenter of a light-emitting position of each pixel with emphasis on image quality, layout of the light emitting region is preferably at a center of the pixel in the pixel regions 6 and 11. It is not noticeable in a case of a narrow pitch panel in which pixels cannot be visually recognized. However, in a case of a wide pitch panel in which pixels can be visually recognized, matching the barycenter of the light-emitting position of each pixel with emphasis on image quality is recommended. As a guide, when the pitch panel is wider than 220 ppi, the pixel can be visually recognized.

Figure 28:
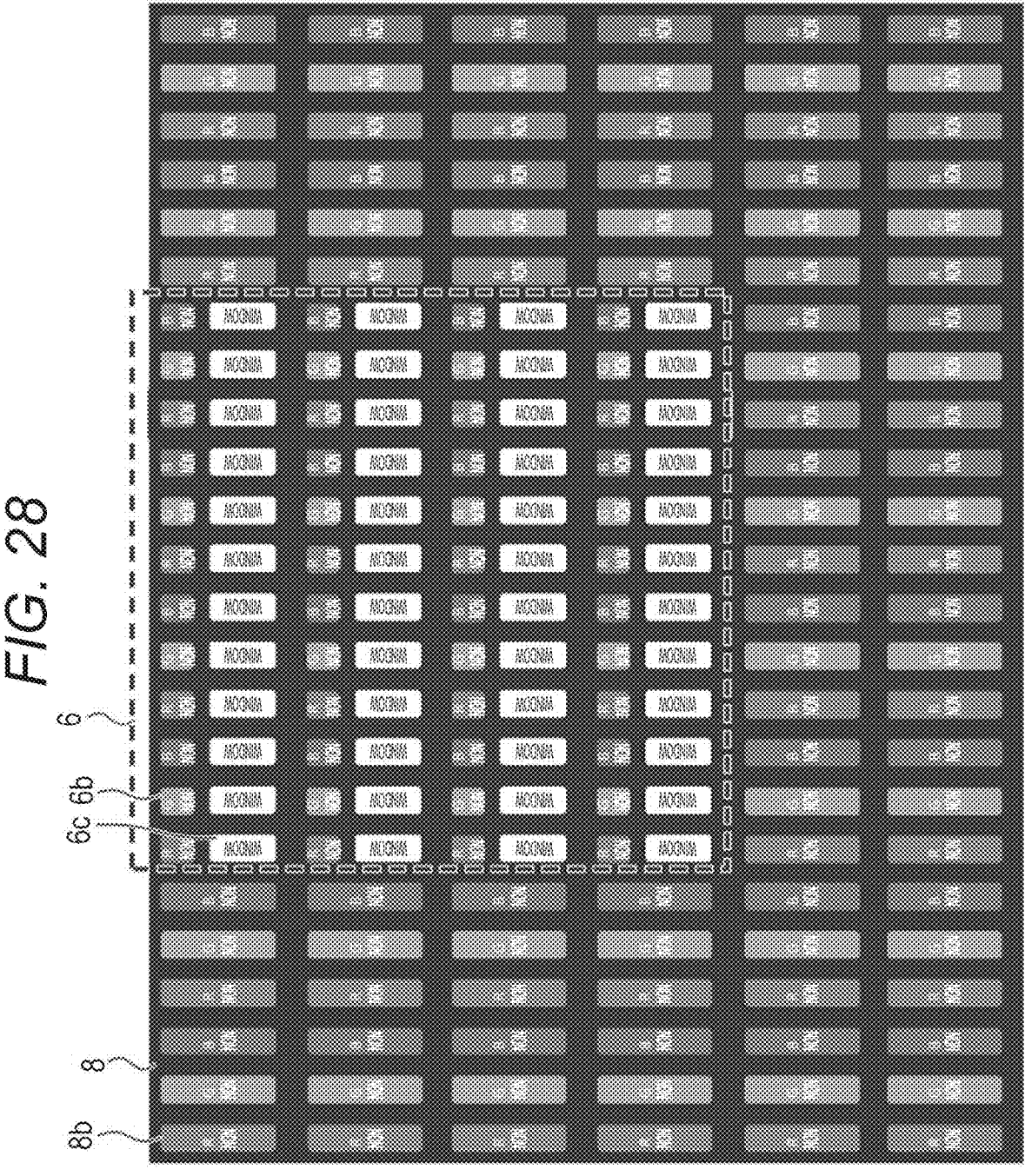
FIG. 28 is a view illustrating pixel arrangement according to a comparative example of FIG. 27.

FIG. 28 is a view illustrating pixel arrangement according to a comparative example of FIG. 27. FIG. 28 is obtained by omitting the second pixel region 11 from FIG. 27. In this case, the first pixel region 6 is arranged adjacent to the third pixel region 8, and luminance decrease due to deterioration of each pixel 7 in the first pixel region 6 is easily noticeable.

Figure 29:
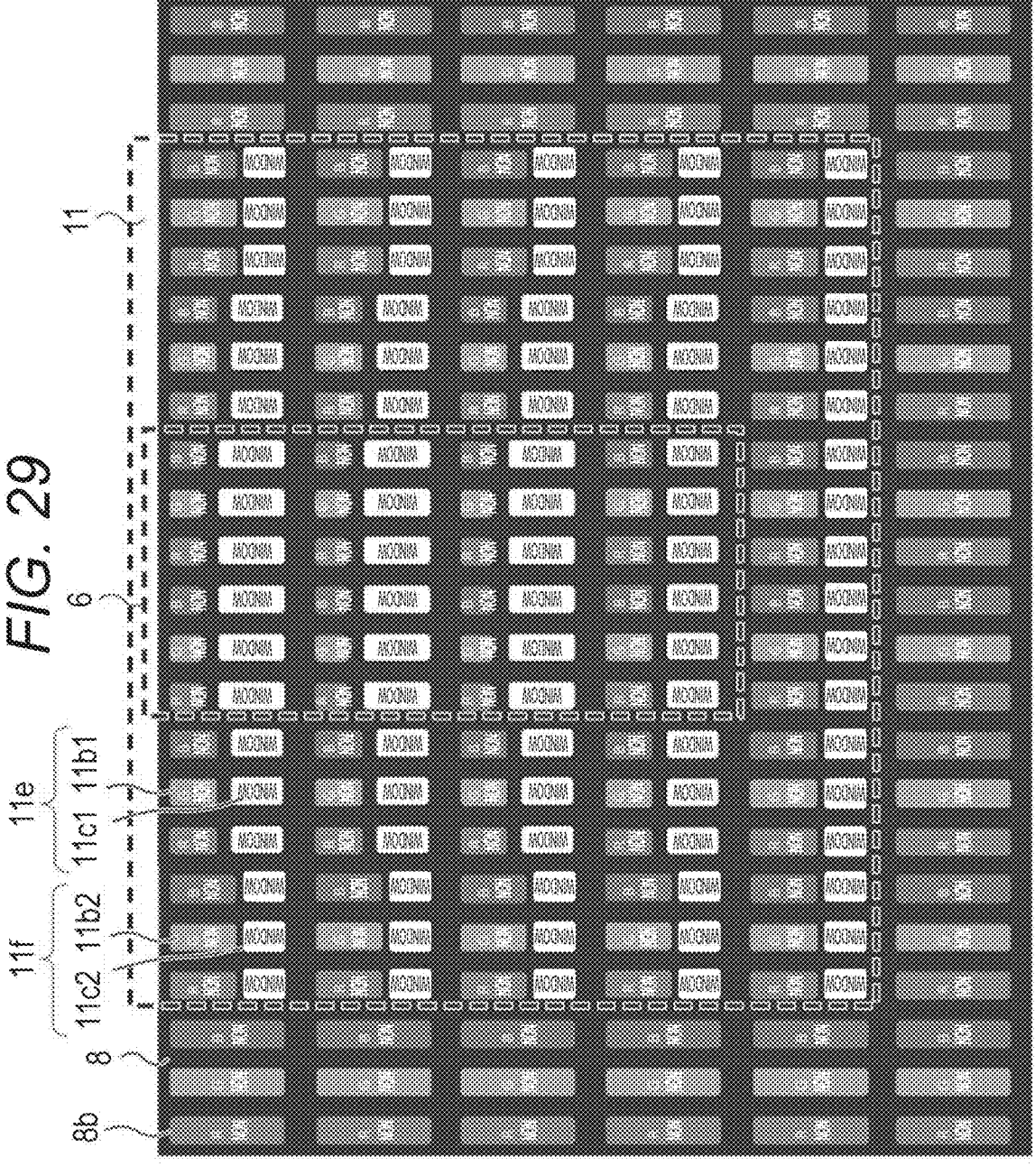
FIG. 29 is a view illustrating a second example of pixel arrangement in the first to third pixel regions.

FIG. 29 is a view illustrating a second example of pixel arrangement in the first to third pixel regions 6, 11, and 8. Although the display panel 2 in FIG. 27 includes three types of pixel regions (the first to third pixel regions 6, 11, and 8) having different light-emitting areas, four or more types of pixel regions having individually different light-emitting areas may be provided in the display panel 2.

FIG. 29 illustrates an example in which the second pixel region 11 includes a second (a) pixel region 11e and a second (b) pixel region 11f having mutually different light-emitting areas. The second (a) pixel region 11e is arranged outside the outer edge portion of the first pixel region 6, and includes a second (a) light emitting region 11b1 and a second (a)

non-light emitting region 11c1. The second (b) pixel region 11f is arranged outside an outer edge portion of the second (a) pixel region 11e, and includes a second (b) light emitting region 11b2 and a second (b) non-light emitting region 11c2. A light-emitting area of the second (a) light emitting region 11b1 is larger than a light-emitting area of the first light emitting region 6b and smaller than a light-emitting area of the second (b) light emitting region 11b2.

Since the display panel 2 in FIG. 29 includes the three types of pixel regions (the first, second (a), and second (b) pixel regions 6, 11e, and 11f) having the different light-emitting areas, a degree of luminance decrease due to deterioration increases in descending order of the light-emitting area. Therefore, luminance decrease due to deterioration in the first pixel region 6 is further less noticeable than in FIG. 27.

As a further modification of the display panel 2 of FIG. 29, four or more types of pixel regions having different light-emitting areas may be provided. As the number of types of pixel regions having individually different light-emitting areas increases, luminance decrease due to deterioration in the first pixel region 6 becomes further less noticeable.

Figure 30:
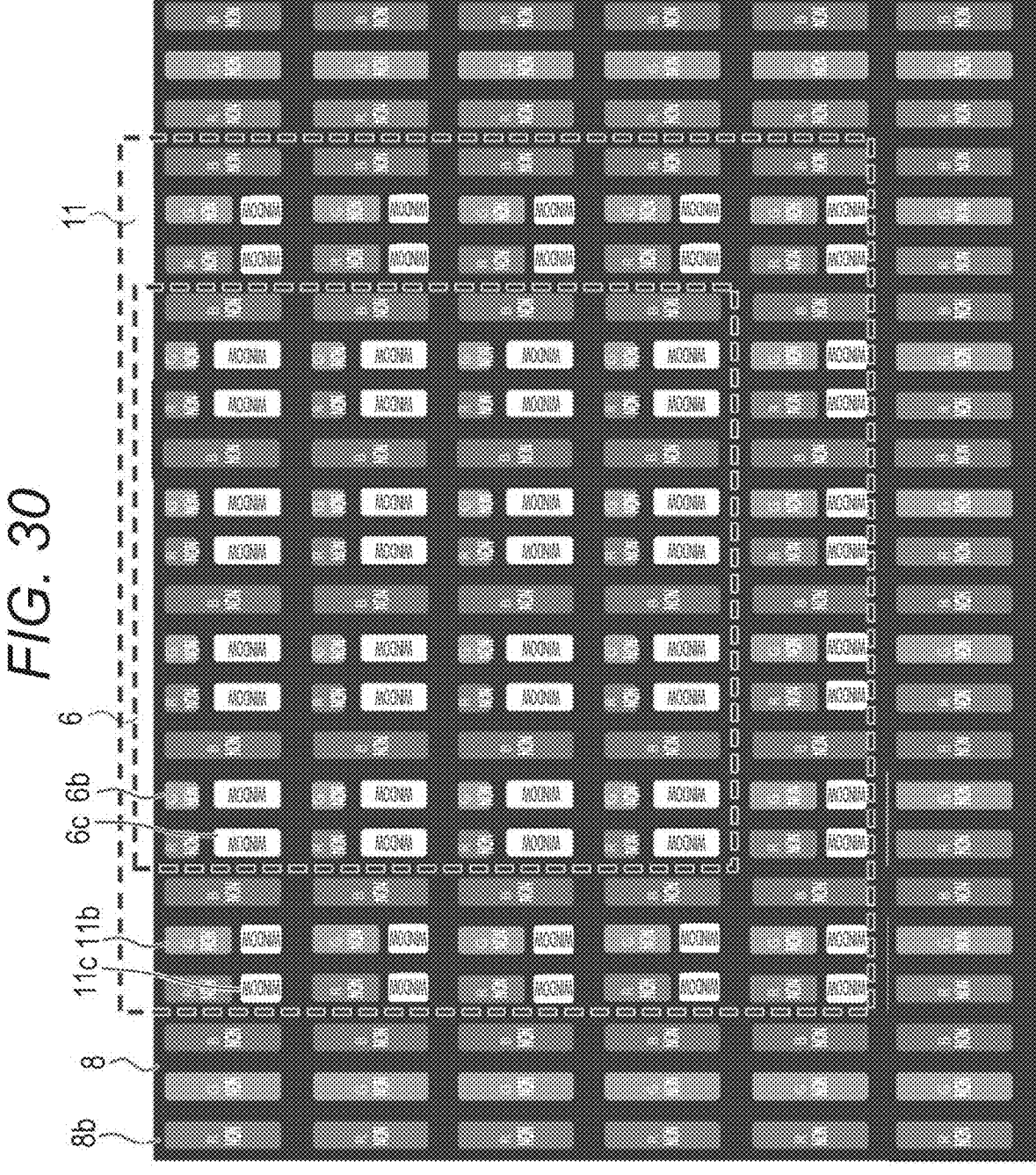
FIG. 30 is a view illustrating a third example of pixel arrangement in the first to third pixel regions.

FIG. 30 is a view illustrating a third example of pixel arrangement in the first to third pixel regions 6, 11, and 8. Among the color pixels 7 of RGB, the blue (B) color pixel 7 is more likely to cause luminance decrease due to deterioration than the color pixels 7 of other colors. Therefore, FIG. 30 illustrates an example in which the non-light emitting region is not provided in the blue color pixel 7, and the entire region is set as the light emitting region.

Among the color pixels 7 in the first pixel region 6 in FIG. 30, the red and green color pixels 7 include the first light emitting region 6b and the first non-light emitting region 6c, whereas the entire region of the blue color pixel 7 is the light emitting region and is not provided with the first non-light emitting region 6c. Similarly, among the color pixels 7 in the second pixel region 11, the red and green color pixels 7 include the second light emitting region 11b and the second non-light emitting region 11c, whereas the entire region of the blue color pixel 7 is the light emitting region, and is not provided with the second non-light emitting region 11c.

In the display panel 2 of FIG. 30, light cannot be transmitted through the blue color pixel 7, but light can be transmitted through the transmissive window 6d in the color pixel 7 of other colors. Therefore, although an amount of light incident on the sensor 5 is slightly reduced, the sensor 5 can be operated normally.

Figure 31:
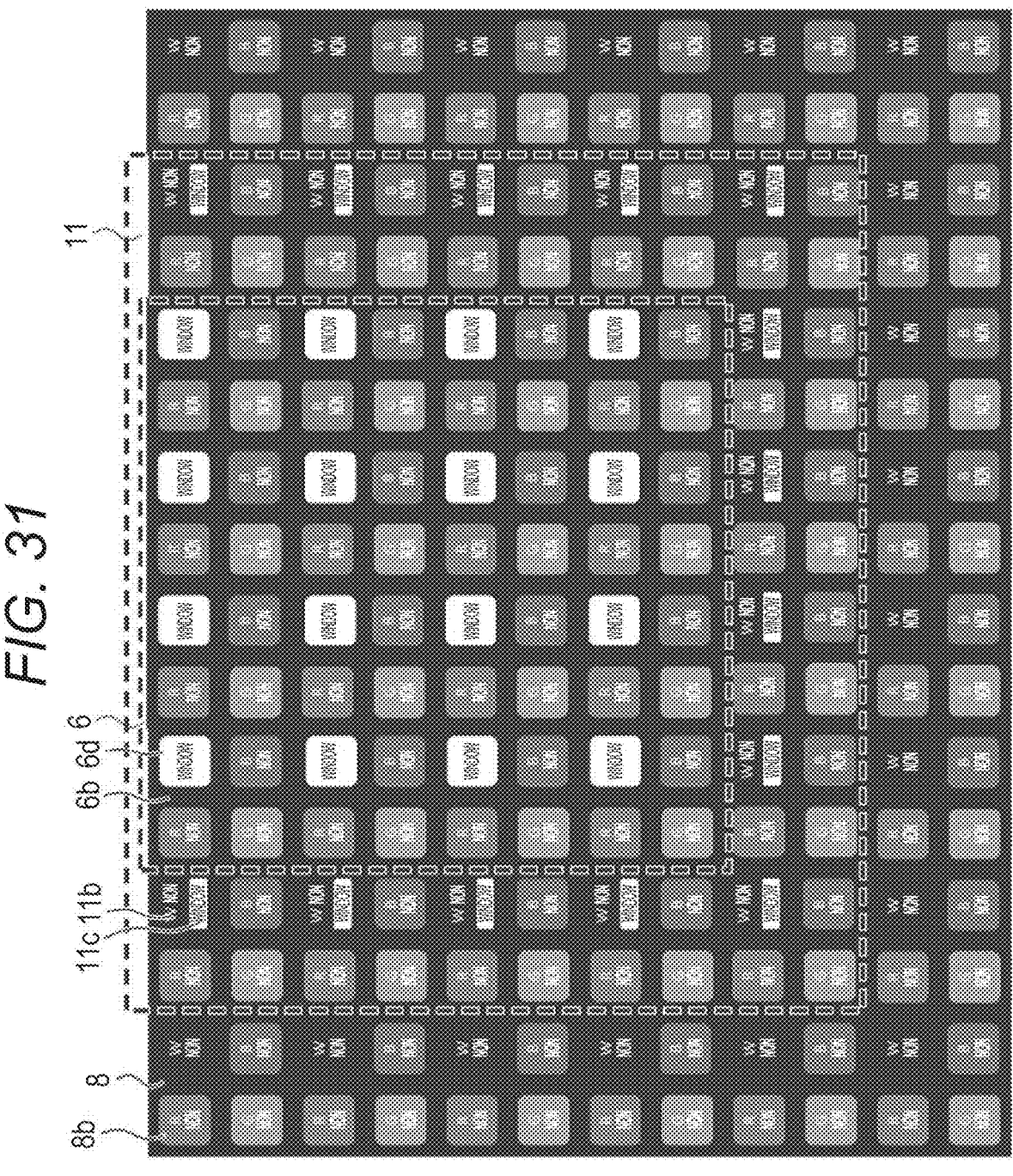
FIG. 31 is a view illustrating a fourth example of pixel arrangement in the first to third pixel regions.

FIG. 31 is a view illustrating a fourth example of pixel arrangement in the first to third pixel regions 6, 11, and 8. In some cases, the color pixels 7 of colors other than the three colors of RGB are provided in the display panel 2. The display panel 2 in FIG. 31 includes white (W) color pixels 7 in addition to the three colors of RGB. Since color display can be realized even if the white color pixels 7 are not originally provided, in the display panel 2 of FIG. 31, all the white color pixels 7 in the first pixel region 6 located immediately above the sensor 5 are set as the transmissive window 6d. Then, for the RGB color pixels 7 in the first pixel region 6, the entire region is set as the first light emitting region 6b, and the first non-light emitting region 6c and the transmissive window 6d are not provided. Furthermore, for the white color pixel 7 in the second pixel region 11, the second light emitting region 11b and the second non-light emitting region 11c are provided, and the transmissive window 6d is provided in the second non-light emitting region 11c. Note that the transmissive window 6d may not be provided in the second non-light emitting region 11c in the second pixel region 11.

Furthermore, in the display panel 2 of FIG. 31, the red and green color pixels 7 in the first pixel region 6 and the second pixel region 11 do not need to be changed, and the entire region of the white color pixel 7 in the first pixel region 6 may simply be replaced with the transmissive window 6d, which facilitates pixel design.

As described above, in the first embodiment, when the sensor 5 is arranged immediately below the display panel 2, the first pixel region 6 is provided at a position overlapping with the sensor 5 in the display panel 2, the second pixel region 11 is provided outside an outer edge portion of the first pixel region 6, and the third pixel region 8 is provided outside an outer edge portion of the second pixel region 11. Then, a light-emitting area of the second pixel region 11 is made larger than a light-emitting area of the first pixel region 6, and a light-emitting area of the third pixel region 8 is made larger than a light-emitting area of the second pixel region 11. A current per unit area flowing through the OLED 20 of each pixel 7 varies depending on a light-emitting area in each pixel 7, and luminance decrease is more likely to occur due to deterioration as the light-emitting area is smaller. In the present embodiment, the second pixel region 11 having a light-emitting area larger than the first pixel region 6 and smaller than the third pixel region 8 is provided between the first pixel region 6 in which luminance decrease due to deterioration is most likely to occur and the third pixel region 8 that emits light over the entire region in the pixel 7. Therefore, luminance decrease due to deterioration is more likely to occur in the order of the first pixel region 6, the second pixel region 11, and the third pixel region 8, and there is no pixel boundary where the luminance rapidly decreases in the entire display panel 2, so that luminance decrease due to deterioration of the first pixel region 6 becomes less noticeable.

Second Embodiment

In the first embodiment, by providing a plurality of pixel regions having different light-emitting areas, a degree of luminance decrease due to deterioration has gradually changed, and the luminance decrease has been made unnoticeable. On the other hand, in an image display device 1 according to a second embodiment, luminance decrease due to deterioration is directly suppressed.

Figure 32A:
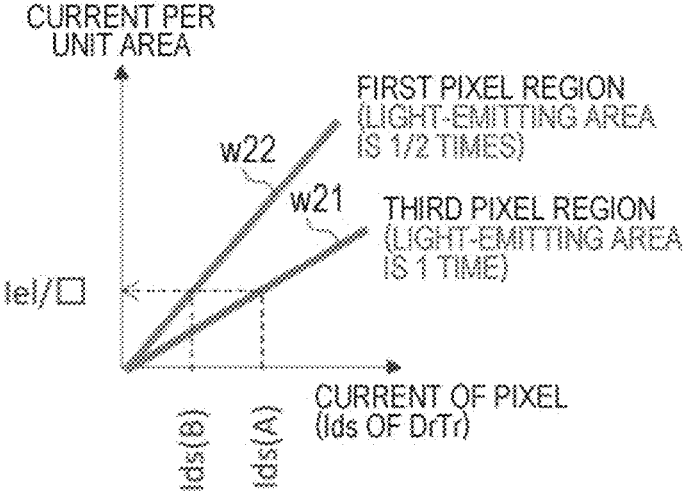
FIG. 32A is a view illustrating current characteristics of a pixel.
Figure 32B:
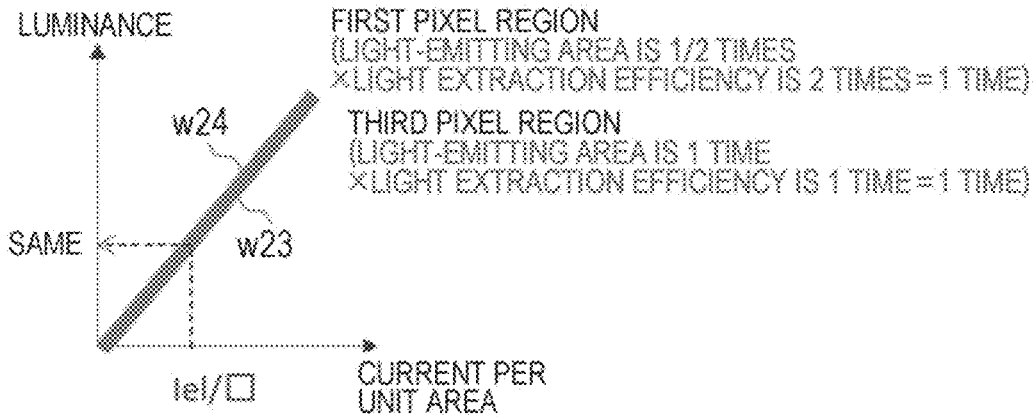
FIG. 32B is a view illustrating element characteristics of an OLED in a pixel circuit.

FIG. 32A is a view illustrating current characteristics of a pixel 7, and FIG. 32B is a view illustrating element characteristics of an OLED 20 in the pixel circuit 12. A waveform w21 in FIG. 32A indicates a current characteristic of the pixel 7 having a light-emitting area of 1 time, and a waveform w22 indicates a current characteristic of the pixel 7 having a light-emitting area of ½ times. In FIG. 32A, a horizontal axis represents a current of the pixel 7, and a vertical axis represents a current per unit area. When the light-emitting area becomes ½ times, the current per unit area increases, and thus an inclination of the waveform w22 becomes larger than an inclination of the waveform w21.

A waveform w23 in FIG. 32B is an element characteristic when a light-emitting area is ½ times and light extraction efficiency is 2 times, and a waveform w24 is an element characteristic when a light-emitting area is 1 time and light extraction efficiency is 1 time. In FIG. 32B, a horizontal axis represents a current per unit area, and a vertical axis represents luminance. The waveforms w23 and w24 in FIG. 32B have substantially the same inclination. This means, in other words, even if the light-emitting area is ½ times, deterioration characteristics equivalent to those of the pixel 7 having the light-emitting area of 1 time and the light extraction efficiency of 1 time can be obtained when the light extraction efficiency becomes 2 times. Note that, in consideration of the fact that the light extraction efficiency as a pixel is between 1 to 2 times, a countermeasure of changing the light-emitting area stepwise similarly to FIGS. 20 and 22 is effective.

Figure 33:
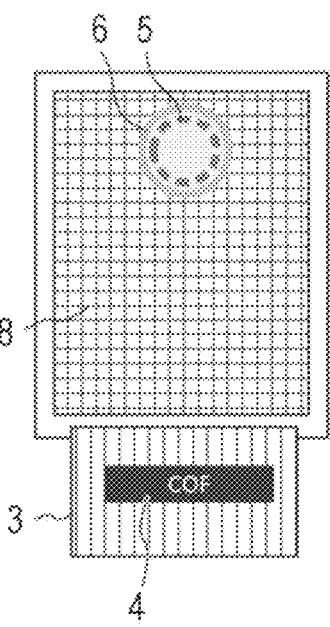
FIG. 33 is a plan view of a display panel according to a second embodiment.

FIG. 33 is a plan view of a display panel 2 according to the second embodiment. In the display panel 2 of FIG. 33, an outer edge portion of a first pixel region 6 is outside an outer edge portion of a sensor 5, and a third pixel region 8 is outside the outer edge portion of the first pixel region 6.

Figure 34:
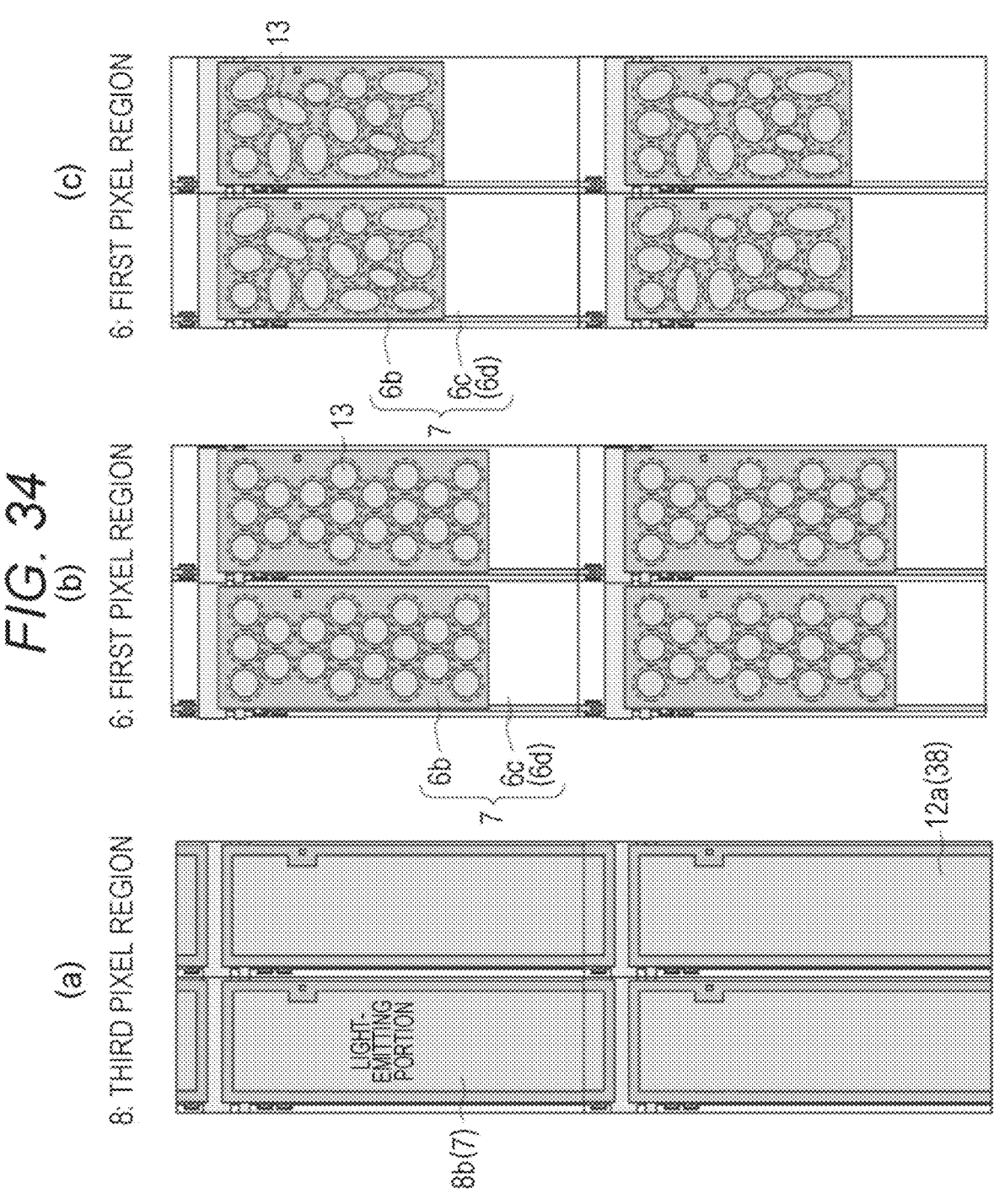
FIGS. 34(*a*), 34(*b*), and 34(*c*) are pixel layout views of the display panel in FIG. 33.

FIG. 34 is a pixel layout view of the display panel 2 in FIG. 33. FIG. 34(*a*) illustrates a pixel layout of the third pixel region 8, and FIG. 34(*b*) illustrates a pixel layout of the first pixel region 6. FIG. 34(*c*) illustrates a first pixel region 6 according to a modification of FIG. 34(*b*).

The second pixel region 11 included in the display panel 2 according to the first embodiment does not exist in the display panel 2 illustrated in FIGS. 33 and 34.

The first pixel region 6 includes a first light emitting region 6*b* and a first non-light emitting region 6*c*. In the example of FIG. 34(*b*), a transmissive window 6*d* exists in the first non-light emitting region 6*c*, but the transmissive window 6*d* is not essential. The first light emitting region 6*b* includes a plurality of reflective members 13. The plurality of reflective members 13 is arranged close to an anode electrode layer 38, and reflects or scatters light emitted from a display layer 2*a* sandwiched between the anode electrode layer 38 and a cathode electrode layer 39, to improve light extraction efficiency. While the individual reflective members 13 in the first light emitting region 6*b* in FIG. 34(*b*) indicate an example in which a planar shape and a size are the same, the individual reflective members 13 in the first light emitting region 6*b* in FIG. 34(*c*) indicate an example in which the planar shape and the size are non-uniform, that is, random. In the case of FIG. 34(*c*), since a reflection direction or a scattering direction of light is random for every reflective member 13 each, uniform light can be emitted from the entire region of the first light emitting region 6*b* in the pixel 7.

In the first pixel region 6 located immediately above the sensor 5, since a current per unit area increases, deterioration is promoted and luminance decrease is likely to occur. However, as illustrated in FIG. 34(*b*), by providing the plurality of reflective members 13 in the first pixel region 6, it is possible to improve extraction efficiency of light emitted from the OLED 20. Therefore, a current flowing through the OLED 20 can be reduced accordingly, and as a result, the current per unit area can be suppressed, deterioration is less likely to occur, and the luminance decrease is less likely to occur.

Although the display panel 2 of FIGS. 33 and 34 does not include the second pixel region 11 included in the display panel 2 according to the first embodiment, it is also conceivable that the display panel 2 includes the second pixel region 11 and has improved light extraction efficiency.

Figure 35:
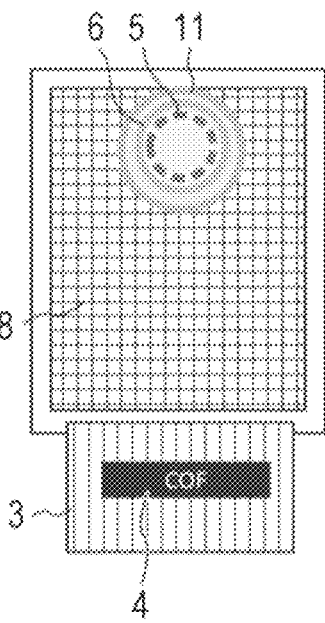
FIG. 35 is a plan view of a display panel according to a modification of FIG. 33.

FIG. 35 is a plan view of a display panel 2 according to a modification of FIG. 33. In the display panel 2 of FIG. 35, an outer edge portion of the first pixel region 6 is outside an outer edge portion of the sensor 5, an outer edge portion of the second pixel region 11 is outside the outer edge portion of the first pixel region 6, and the third pixel region 8 exists outside the outer edge portion of the second pixel region 11. As described above, the display panel 2 in FIG. 35 includes the first to third pixel regions 6, 11, 8 similarly to the display panel 2 according to the first embodiment.

Figure 36:
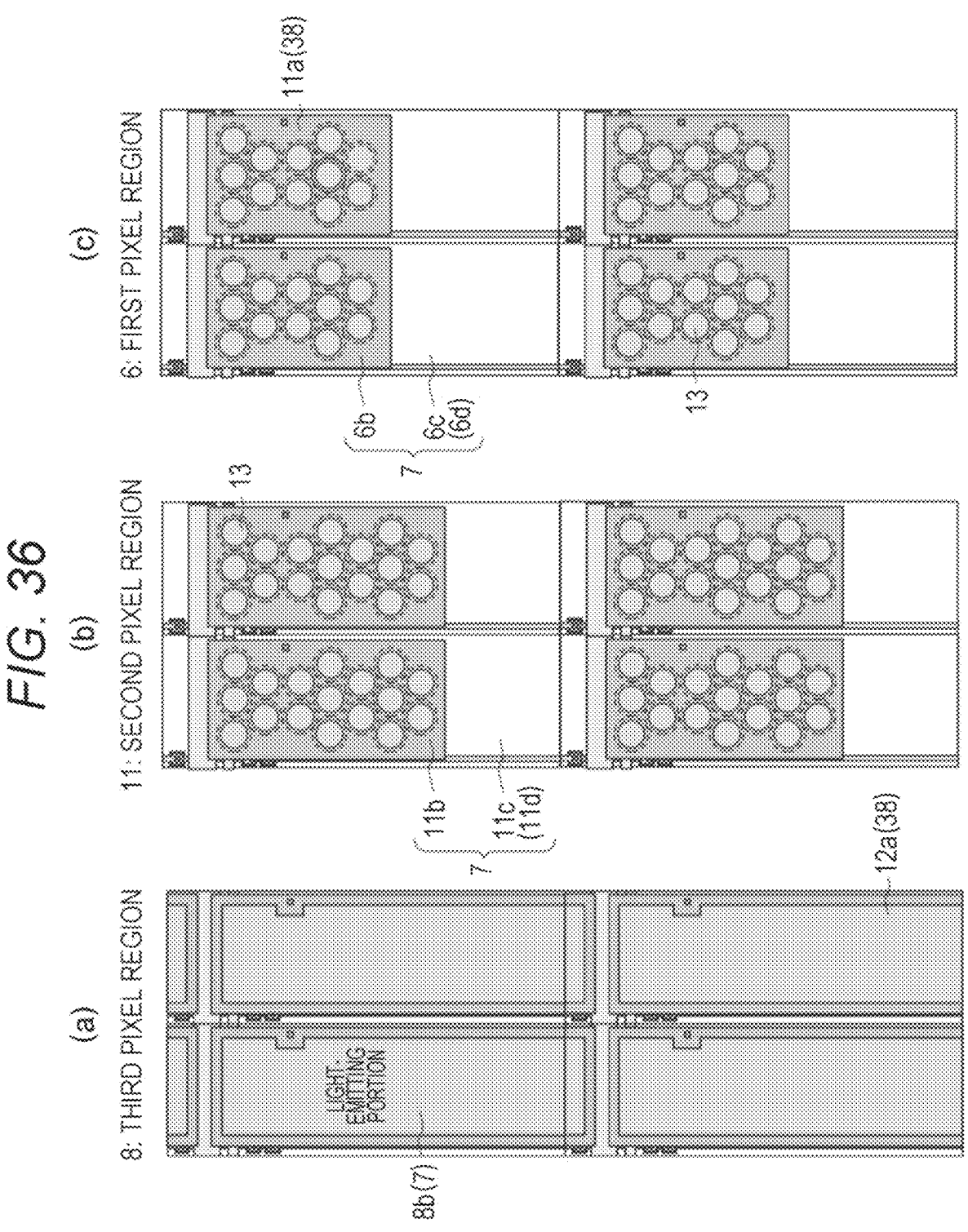
FIG. 36 is a pixel layout view of the display panel in FIG. 35.

FIG. 36 is a pixel layout view of the display panel 2 in FIG. 35. FIG. 36(*a*) illustrates a pixel layout of the third pixel region 8, FIG. 36(*b*) illustrates a pixel layout of the second pixel region 11, and FIG. 36(*c*) illustrates a pixel layout of the first pixel region 6. In the third pixel region 8, substantially the entire region of the pixel 7 is a light emitting region. The first pixel region 6 includes the first light emitting region 6*b* and the first non-light emitting region 6*c*. The second pixel region 11 includes the second light emitting region 11*b* and the second non-light emitting region 11*c*. A light-emitting area of the second light emitting region 11*b* is larger than a light-emitting area of the first light emitting region 6*b*. Therefore, a current per unit area of the first light emitting region 6*b* is larger than a current per unit area of the second light emitting region 11*b*. The first non-light emitting region 6*c* in the first pixel region 6 in FIG. 36(*c*) and the second non-light emitting region 11*c* in the second pixel region 11 in FIG. 36(*b*) do not include the transmissive window 6*d*, but may include the transmissive window 6*d*.

Since the display panel 2 of FIGS. 35 and 36 includes the plurality of reflective members 13 in the first light emitting region 6*b* and the second light emitting region 11*b*, light extraction efficiency can be improved, and luminance can be secured even if the current per unit area is reduced accordingly. Therefore, by reducing the current per unit area, luminance decrease due to deterioration can be made less likely to occur.

Figure 37:
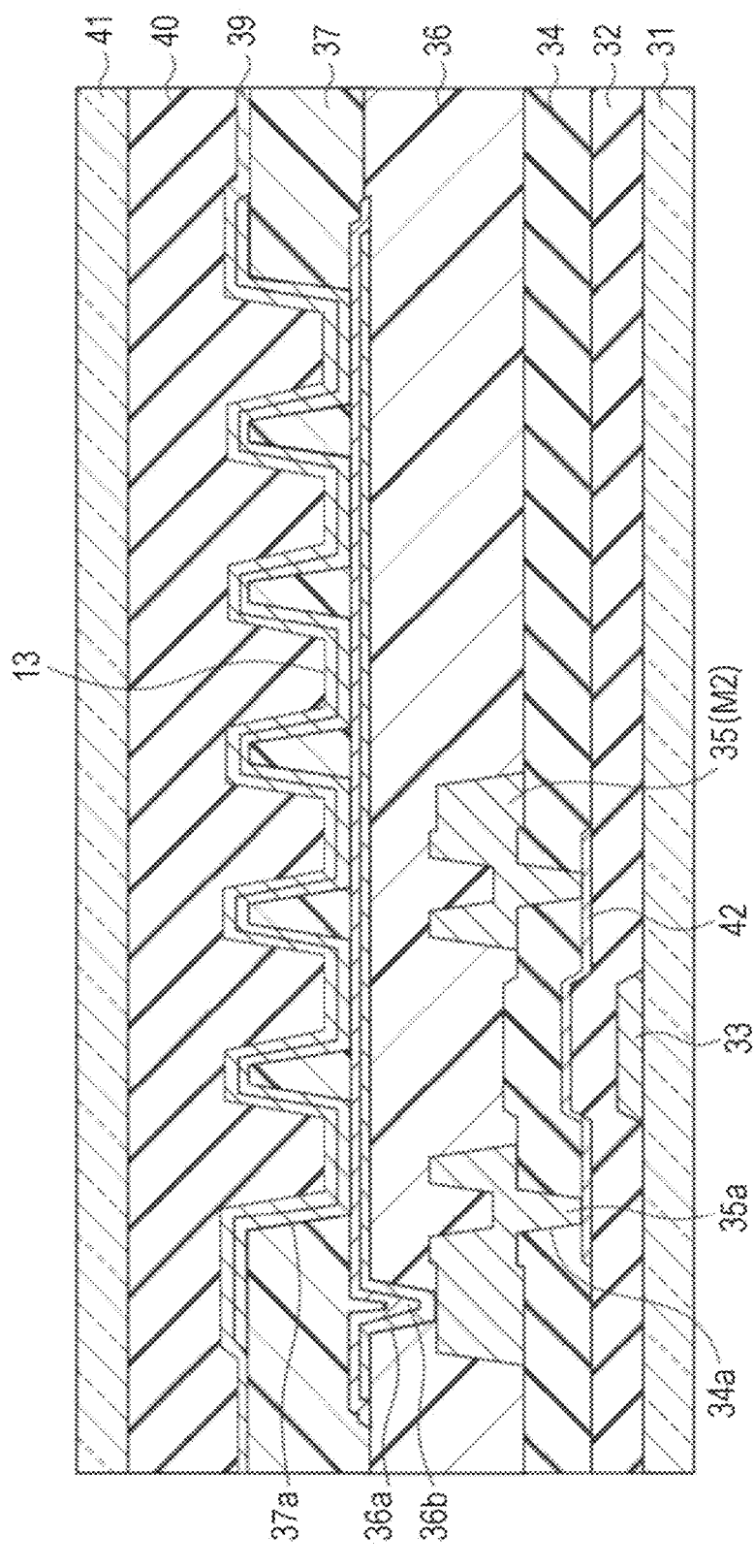
FIG. 37 is a cross-sectional view of the display panel including a plurality of reflective members in FIGS. 34 and 36.

FIG. 37 is a cross-sectional view of the display panel 2 including the plurality of reflective members 13 in FIGS. 34 and 36. The plurality of reflective members 13 can be formed by causing a layered body including an anode electrode layer, a display layer, and a cathode electrode layer to have an uneven structure. A protrusion of the uneven structure includes a tapered side wall. Light emitted from the display layer is reflected or scattered by a side wall portion of the protrusion, and travels in a normal direction of the display surface of the display panel 2. Light extraction efficiency can be improved by increasing the number of protrusions. Furthermore, by making a distance between adjacent protrusions irregular, it is possible to form the reflective member 13 having an irregular shape as illustrated in FIG. 34(*c*).

As described above, in the display panel 2 according to the second embodiment, since the light extraction efficiency of the first pixel region 6 located immediately above the sensor 5 is improved, burn-in is less likely to occur, and luminance decrease due to deterioration can be suppressed. Therefore, it is not necessary to provide the second pixel region 11 that reduces the luminance stepwise.

(Application Example of Image Display Device 1 and Electronic Device 50 According to Present Disclosure)

First Application Example

Figure 38A:
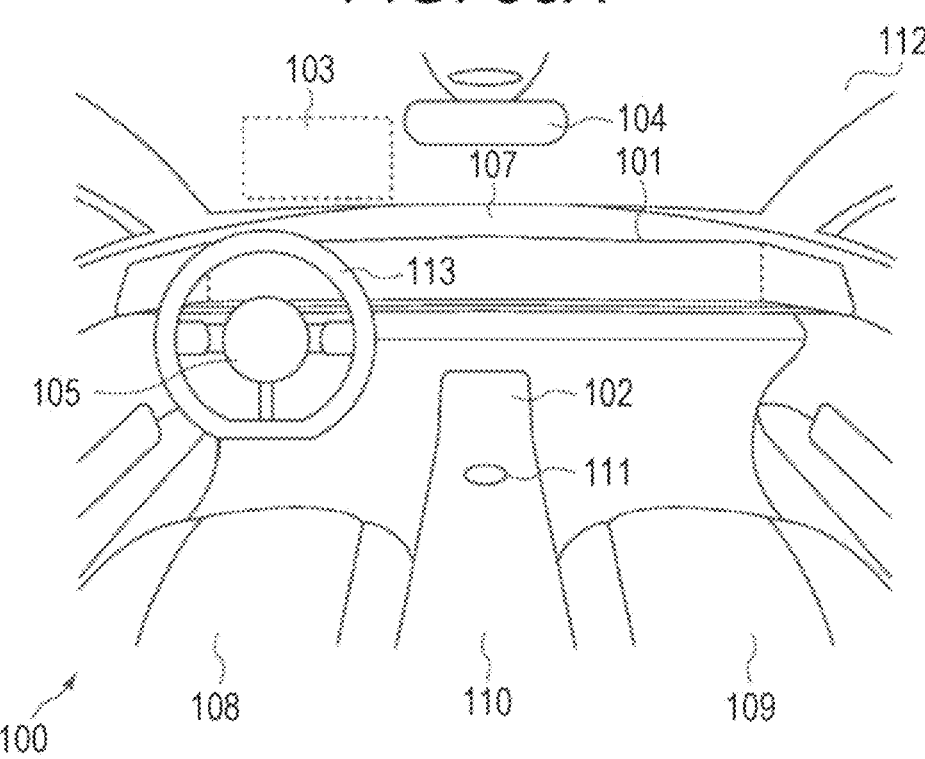
FIG. 38A is a view illustrating an internal state of a conveyance from a rear side to a front side of the conveyance.
Figure 38B:
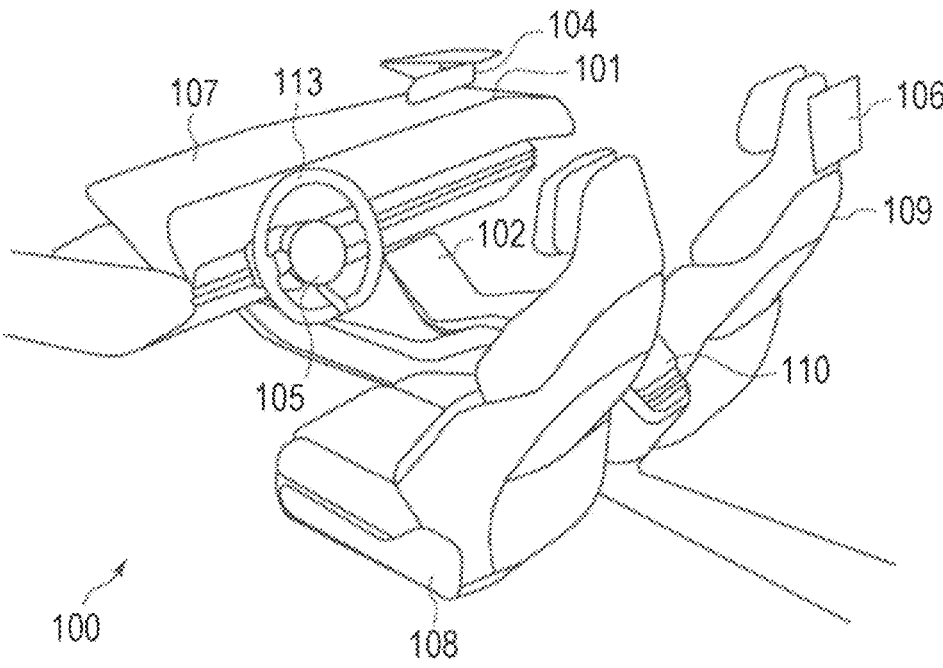
FIG. 38B is a view illustrating an internal state of the conveyance from an oblique rear side to an oblique front side of the conveyance.

The image display device 1 and the electronic device 50 according to the present disclosure can be used for various purposes. FIGS. 38A and 38B are views illustrating an internal configuration of a conveyance 100 as a first application example of the electronic device 50 including the image display device 1 according to the present disclosure. FIG. 38A is a view illustrating an internal state of the conveyance 100 from a rear side to a front side of the conveyance 100, and FIG. 38B is a view illustrating an internal state of the conveyance 100 from an oblique rear side to an oblique front side of the conveyance 100.

The conveyance 100 of FIGS. 38A and 38B includes a center display 101, a console display 102, a head-up display 103, a digital rear mirror 104, a steering wheel display 105, and a rear entertainment display 106.

The center display 101 is arranged on a dashboard 107 at a position facing a driver seat 108 and a passenger seat 109. FIG. 38 illustrates an example of the center display 101 having a horizontally long shape extending from the driver seat 108 side to the passenger seat 109 side, but any screen size and arrangement location of the center display 101 may be adopted. The center display 101 can display information sensed by the various sensors 5. As a specific example, the center display 101 can display a captured image captured by an image sensor, an image of a distance to an obstacle in front of or on a side of the conveyance measured by a ToF sensor 5, a passenger's body temperature detected by an infrared sensor 5, and the like. The center display 101 can be used to display, for example, at least one of safety-related information, operation-related information, a life log, health-related information, authentication/identification-related information, or entertainment-related information.

The safety-related information is information of doze sensing, looking-away sensing, sensing of mischief of a child riding together, presence or absence of wearing of a seat belt, sensing of leaving of an occupant, and the like, and is information sensed by the sensor 5 arranged to overlap with a back surface side of the center display 101, for example. The operation-related information senses a gesture related to an operation by the occupant by using the sensor 5. The sensed gestures may include an operation of various types of equipment in the conveyance 100. For example, operations of air conditioning equipment, a navigation device, an AV device, a lighting device, and the like are sensed. The life log includes a life log of all the occupants. For example, the life log includes an action record of each occupant in the conveyance. By acquiring and storing the life log, it is possible to check a state of the occupant at a time of an accident. The health-related information senses a body temperature of an occupant by using the temperature sensor 5, and estimates a health condition of the occupant on the basis of the sensed body temperature. Alternatively, the face of the occupant may be imaged by using an image sensor, and the health condition of the occupant may be estimated from the imaged facial expression. Moreover, a conversation may be made with the occupant in automatic voice, and the health condition of the occupant may be estimated on the basis of an answer content of the occupant. The authentication/identification-related information includes a keyless entry function of performing face authentication by using the sensor 5, a function of automatically adjusting a seat height and position in face identification, and the like. The entertainment-related information includes a function of detecting operation information of the AV device by the occupant by using the sensor 5, a function of recognizing the face of the occupant by the sensor 5 and providing a content suitable for the occupant by the AV device, and the like.

The console display 102 can be used to display the life log information, for example. The console display 102 is arranged near a shift lever 111 of a center console 110 between the driver seat 108 and the passenger seat 109. The console display 102 can also display information sensed by the various sensors 5. Furthermore, the console display 102 may display an image of a periphery of the vehicle captured by the image sensor, or may display an image of a distance to an obstacle in the periphery of the vehicle.

The head-up display 103 is virtually displayed behind a windshield 112 in front of the driver seat 108. The head-up display 103 can be used to display, for example, at least one of safety-related information, operation-related information, a life log, health-related information, authentication/identification-related information, or entertainment-related information. Since the head-up display 103 is virtually arranged in front of the driver seat 108 in many cases, the head-up display 103 is suitable for displaying information directly related to an operation of the conveyance 100 such as a speed of the conveyance 100 and a remaining amount of fuel (a battery).

The digital rear mirror 104 can also display a state of an occupant in the rear seat in addition to the rear side of the conveyance 100, and thus can be used to display the life log information, for example, by arranging the sensor 5 to overlap with a back surface side of the digital rear mirror 104.

The steering wheel display 105 is arranged near a center of a steering wheel 113 of the conveyance 100. The steering wheel display 105 can be used to display, for example, at least one of safety-related information, operation-related information, a life log, health-related information, authentication/identification-related information, or entertainment-related information. In particular, since the steering wheel display 105 is close to the driver's hand, the steering wheel display 105 is suitable for displaying the life log information such as a body temperature of the driver, or for displaying information related to an operation of the AV device, air conditioning equipment, or the like.

The rear entertainment display 106 is attached to a back side of the driver seat 108 and the passenger seat 109, and is for viewing by an occupant in the rear seat. The rear entertainment display 106 can be used to display, for example, at least one of safety-related information, operation-related information, a life log, health-related information, authentication/identification-related information, or entertainment-related information. In particular, since the rear entertainment display 106 is in front of the occupant in the rear seat, information related to the occupant in the rear seat is displayed. For example, information related to an operation of the AV device or the air conditioning equipment may be displayed, or a result of measuring a body temperature or the like of the occupant in the rear seat by the temperature sensor 5 may be displayed.

As described above, arranging the sensor 5 to overlap with the back surface side of the image display device 1 makes it possible to measure a distance to an object existing in the surroundings. Optical distance measurement methods are roughly classified into a passive type and an active type. In the passive type, distance measurement is performed by receiving light from an object without projecting light from the sensor 5 to the object. The passive type includes a lens focus method, a stereo method, a monocular vision method, and the like. In the active type, distance measurement is performed by projecting light onto an object, and receiving reflected light from the object with the sensor 5 to measure a distance. Examples of the active type include an optical radar method, an active stereo method, an illuminance difference stereo method, a moire topography method, and an interference method. The image display device 1 according to the present disclosure can be applied to any of these types of distance measurement. By using the sensor 5 arranged to overlap with the back surface side of the image display device 1 according to the present disclosure, the distance measurement of the passive type or the active type described above can be performed.

Second Application Example

The image display device 1 according to the present disclosure is applicable not only to various displays used in conveyances but also to displays mounted on various electronic devices 50.

FIG. 39A is a front view of a digital camera 120 as a second application example of the electronic device 50, and FIG. 39B is a rear view of the digital camera 120. The digital camera 120 in FIGS. 39A and 39B illustrates an example of a single-lens reflex camera in which a lens 121 is replaceable, but the image display device 1 is also applicable to a camera in which the lens 121 is not replaceable.

In the camera of FIGS. 39A and 39B, when a person who captures an image looks into an electronic viewfinder 124 to determine a composition while holding a grip 123 of a camera body 122, and presses a shutter 125 while adjusting focus, image-capturing data is stored in a memory in the camera. As illustrated in FIG. 39B, on a back side of the camera, a monitor screen 126 that displays captured data and the like and a live image and the like, and the electronic viewfinder 124 are provided. Furthermore, a sub screen that displays setting information such as a shutter speed and an exposure value may be provided on an upper surface of the camera.

By arranging the sensor 5 so as to overlap with a back surface side of the monitor screen 126, the electronic viewfinder 124, the sub screen, and the like used for the camera, the camera can be used as the image display device 1 according to the present disclosure.

Third Application Example

The image display device 1 according to the present disclosure is also applicable to a head mounted display (hereinafter, referred to as an HMD). The HMD can be used for virtual reality (VR), augmented reality (AR), mixed reality (MR), substitutional reality (SR), and the like.

FIG. 40A is an external view of an HMD 130 as a third application example of the electronic device 50. The HMD 130 of FIG. 40A includes a mounting member 131 for attachment to cover human eyes. The mounting member 131 is hooked and fixed to a human ear, for example. A display device 132 is provided inside the HMD 130, and a wearer of the HMD 130 can visually recognize a stereoscopic image and the like with the display device 132. The HMD 130 includes, for example, a wireless communication function, an acceleration sensor, and the like, and can switch a stereoscopic image and the like displayed on the display device 132 in accordance with a posture, a gesture, and the like of the wearer.

Furthermore, a camera may be provided in the HMD 130 to capture an image around the wearer, and an image obtained by combining the captured image of the camera and an image generated by a computer may be displayed on the display device 132. For example, arranging a camera to overlap with a back surface side of the display device 132 visually recognized by the wearer of the HMD 130, capturing an image of a periphery of an eye of the wearer with the camera, and displaying the captured image on another display provided on an outer surface of the HMD 130, a person around the wearer can grasp expression of the face and a movement of the eyes of the wearer in real time.

Figure 40B:
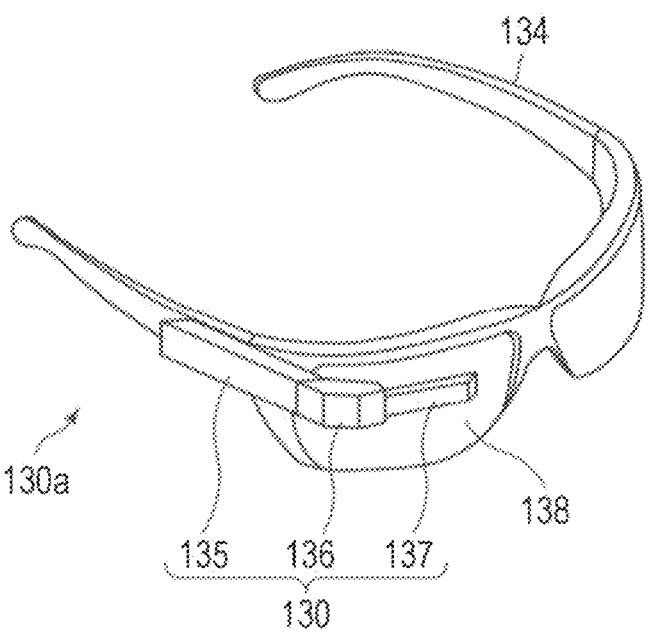
FIG. 40B is an external view of a smart glass.

Note that various types of the HMD 130 are conceivable. For example, as illustrated in FIG. 40B, the image display device 1 according to the present disclosure can also be applied to a smart glass 130a that displays various types of information on glasses 134. The smart glass 130a in FIG. 40B includes a main body portion 135, an arm portion 136, and a lens barrel portion 137. The main body portion 135 is connected to the arm portion 136. The main body portion 135 is detachable from the glasses 134. The main body portion 135 incorporates a display unit and a control board for control of an operation of the smart glass 130a. The main body portion 135 and the lens barrel are connected to each other via the arm portion 136. The lens barrel portion 137 emits image light emitted from the main body portion 135 through the arm portion 136, to a lens 138 side of the glasses 134. This image light enters human eyes through the lens 138. A wearer of the smart glass 130a in FIG. 40B can visually recognize not only a surrounding situation but also various pieces of information emitted from the lens barrel portion 137 similarly to normal glasses.

Fourth Application Example

The image display device 1 according to the present disclosure is also applicable to a television device (hereinafter, a TV). In recent TVs, a frame tends to be as small as possible from the viewpoint of downsizing and design property. Therefore, in a case where a camera to capture an image of a viewer is provided on a TV, it is desirable to arrange the camera so as to overlap with a back surface side of the display panel 2 of the TV.

Figure 41:
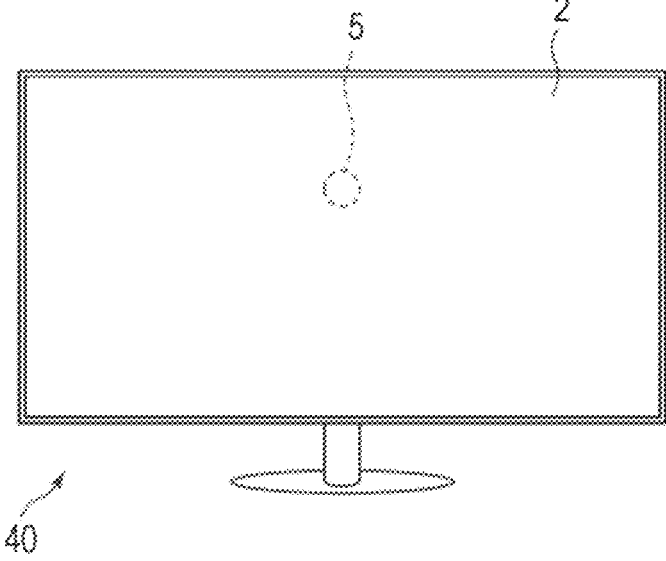
FIG. 41 is an external view of a TV as a fourth application example of the electronic device.

FIG. 41 is an external view of a TV 140 as a fourth application example of the electronic device 50. In the TV 140 of FIG. 41, a frame is minimized, and almost the entire region on a front side is a display area. The TV 140 incorporates the sensor 5 such as a camera to capture an image of a viewer. The sensor 5 in FIG. 41 is arranged on a back side of a part (for example, a broken line part) in the display panel 2. The sensor 5 may be an image sensor module, or various sensors can be applied such as a sensor for face authentication, a sensor for distance measurement, and a temperature sensor, and a plurality of types of sensors may be arranged on the back surface side of the display panel 2 of the TV 140.

As described above, according to the image display device 1 of the present disclosure, the image sensor module 9 can be arranged to overlap with the back surface side of the display panel 2. Therefore, there is no need to arrange a camera or the like on the frame, the TV 140 can be downsized, and there is no possibility that the design is impaired by the frame.

Fifth Application Example

Figure 42:
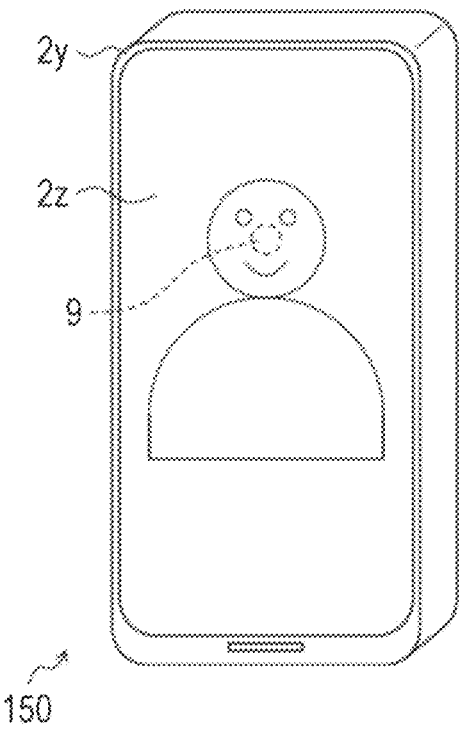
FIG. 42 is an external view of a smartphone as a fifth application example of the electronic device.

The image display device 1 according to the present disclosure is also applicable to a smartphone and a mobile phone. FIG. 42 is an external view of a smartphone 150 as a fifth application example of the electronic device 50. In the example of FIG. 42, the display surface 2z spreads close to an outer size of the electronic device 50, and a width of a bezel 2y around the display surface 2z is set to several mm or less. Typically, a front camera is often mounted on the bezel 2y. However, in FIG. 42, as indicated by a broken line, the image sensor module 9 functioning as a front camera is arranged on a back surface side of a substantially central portion of the display surface 2z, for example. By providing the front camera on a back surface side of the display surface 2z in this manner, it is not necessary to arrange the front camera in the bezel 2y, and the width of the bezel 2y can be narrowed.

Note that the present technology can have the following configurations.

(1) An image display device including:

a plurality of pixels arranged two-dimensionally, in which the plurality of pixels includes:

a first pixel region including a pixel configured to emit light and transmit visible light;

a second pixel region arranged around the first pixel region, and including a pixel configured to emit light with an area larger than a light-emitting area of a pixel in the first pixel region; and a third pixel region arranged around the second pixel region, and including a pixel configured to emit light with an area larger than a light-emitting area of a pixel in the second pixel region.

(2) The image display device according to (1), in which a pixel in the first pixel region includes:

a first light emitting region having a predetermined light-emitting area; and a first non-light emitting region including a first transmissive window configured to transmit visible light, a pixel in the second pixel region includes a second light emitting region having a light-emitting area larger than the predetermined light-emitting area, and a pixel in the third pixel region includes a third light emitting region having a light-emitting area larger than a light-emitting area of the second light emitting region.

(3) The image display device according to (2), in which a pixel in the second pixel region includes a second non-light emitting region including a second transmissive window configured to transmit visible light within a range smaller than the first transmissive window.

(4) The image display device according to (3), in which a pixel in the second pixel region includes a pixel circuit arranged in the second light emitting region and not arranged in the second non-light emitting region.

(5) The image display device according to (3), in which a pixel in the second pixel region includes a pixel circuit arranged in the second light emitting region and the second non-light emitting region.

(6) The image display device according to any one of (3) to (5), in which a pixel in the first pixel region and a pixel in the second pixel region include a plurality of color pixels config-ured to individually emit light in different colors, and the first transmissive window and the second transmissive window are provided for a color pixel of a specific color.

(7) The image display device according to any one of (3) to (5), in which a pixel in the first pixel region and a pixel in the second pixel region include a plurality of color pixels config-ured to individually emit light in different colors, the first non-light emitting region is provided without the first light emitting region being provided for a color pixel of a specific color in the first pixel region, and the first light emitting region is provided without the first non-light emitting region being provided for a color pixel of a color other than the specific color, the second light emitting region and the second non-light emitting region are provided for a color pixel of the specific color in the second pixel region, and the second light emitting region is provided without the second non-light emitting region being provided, for a color pixel of a color other than the specific color in the second pixel region.

(8) The image display device according to (2), in which a pixel in the second pixel region includes a second non-light emitting region configured not to transmit visible light.

(9) The image display device according to any one of (2) to (8), in which the second pixel region includes a plurality of pixels having a light-emitting area that decreases con-tinuously or stepwise from the predetermined light-emitting area.

(10) The image display device according to any one of (2) to (9), in which a pixel in the second light emitting region includes a self light-emitting element, and the self light-emitting element includes:

a lower electrode layer including a light reflecting surface;

a display layer arranged on the lower electrode layer; and an upper electrode layer arranged on the display layer.

(11) The image display device according to (10), in which the upper electrode layer and the display layer have an uneven structure, and an interval between two adjacent protrusions of the uneven structure is irregular.

(12) The image display device according to any one of (1) to (11), in which a pixel group including the first pixel region and the second pixel region is arranged at a plurality of places in the image display region while being separated from each other, and the third pixel region is arranged around the pixel group at the plurality of places.

(13) An electronic device including:

an image display device including a plurality of pixels arranged two-dimensionally; and a light receiving device configured to receive light inci-dent through the image display device, in which the image display device includes:

a plurality of pixels arranged two-dimensionally, and the plurality of pixels includes:

a first pixel region including a pixel configured to emit light and transmit visible light;

a second pixel region arranged around the first pixel region, and including a pixel configured to emit light with an area larger than a light-emitting area of a pixel in the first pixel region; and a third pixel region arranged around the second pixel region, and including a pixel configured to emit light with an area larger than a light-emitting area of a pixel in the second pixel region.

(14) The electronic device according to (13), in which the light receiving device receives light transmitted through the first pixel region.

(15) The electronic device according to (14), in which a pixel in the first pixel region includes:

a first light emitting region having a predetermined light-emitting area; and a first non-light emitting region including a first transmis-sive window configured to transmit visible light, a pixel in the second pixel region includes a second light emitting region having a light-emitting area larger than the predetermined light-emitting area, a pixel in the third pixel region includes a third light emitting region having a light-emitting area larger than a light-emitting area of the second light emitting region, and the light receiving device receives light transmitted through the first non-light emitting region.

(16) The electronic device according to (15), in which a pixel in the second pixel region includes a second non-light emitting region including a second transmissive window configured to transmit visible light within a range smaller than the first transmissive window, and the light receiving device receives light transmitted through the first light emitting region and the second non-light emitting region.

(17) The electronic device according to (16), in which a pixel in the second pixel region includes a pixel circuit arranged in the second light emitting region and not arranged in the second non-light emitting region.

(18) The electronic device according to (16), in which a pixel in the second pixel region includes a pixel circuit arranged in the second light emitting region and the second non-light emitting region.

(19) The electronic device according to any one of (16) to (18), in which a pixel in the first pixel region and a pixel in the second pixel region include a plurality of color pixels configured to individually emit light in different colors, and the first transmissive window and the second transmissive window are provided for a color pixel of a specific color.

(20) The electronic device according to any one of (15) to (19), in which the light receiving device includes at least one of: an imaging sensor configured to photoelectrically convert light incident through the first non-light emitting region; a distance measuring sensor configured to receive light incident through the first non-light emitting region to measure a distance; or a temperature sensor configured to measure a temperature on the basis of light incident through the first non-light emitting region.

Aspects of the present disclosure are not limited to the above-described individual embodiments, but include various modifications that can be conceived by those skilled in the art, and the effects of the present disclosure are not limited to the above-described contents. That is, various additions, modifications, and partial deletions can be made without departing from the conceptual idea and spirit of the present disclosure derived from the contents defined in the claims and equivalents thereof.

REFERENCE SIGNS LIST

1 Image display device
2 Display layer
2 Display panel
2b Anode
2c Hole injection layer
2d Hole transport layer
2e Light-emitting layer
2f Electron transport layer
2g Electron injection layer
2h Cathode
2y Bezel
2z Display surface
3 Flexible printed circuit (FPC)
4 Chip (COF)
5 Sensor
6 First pixel region
6b First light emitting region
6c First non-light emitting region
6d Transmissive window (first transmissive window)
7 Pixel
8 Third pixel region
8b Third light emitting region 9 Image sensor module
9b Image sensor
9c IR cut filter
9d Lens unit
9e Coil
9f Magnet
9g Spring
10 Subject
11 Second pixel region
11a Second self light-emitting element
11b Second light emitting region
11b1 Second (a) light emitting region
11b2 Second (b) light emitting region
11c Second non-light emitting region
11c1 Second (a) non-light emitting region
11c2 Second (b) non-light emitting region
11d Transmissive window (second transmissive window)
11e Second (b) pixel region
11e Second (a) pixel region
11f Second (b) pixel region
12 Pixel circuit
13 Reflective member
31 First transparent substrate
32 First insulating layer
33 First wiring layer
34 Second insulating layer
35 Second wiring layer
36 Third insulating layer
36b Contact member
37 Fourth insulating layer
38 Anode electrode layer
39 Cathode electrode layer
40 Fifth insulating layer
41 Second transparent substrate
42 Semiconductor layer
50 Electronic device
100 Conveyance
101 Center display
102 Console display
103 Head-up display
104 Digital rearview mirror
105 Steering wheel display
106 Rear entertainment display
107 Dashboard
108 Driver seat
109 Passenger seat
110 Center console
111 Shift lever
112 Windshield
113 Steering wheel
120 Digital camera
121 Lens
122 Camera body
123 Grip
124 Electronic viewfinder
125 Shutter
126 Monitor screen
130 Smart glass
131 Mounting member
132 Display device
134 Glasses
135 Main body portion
136 Arm portion
137 Lens barrel portion
138 Lens
150 Smartphone

The invention claimed is:

1. An image display device comprising:

a plurality of pixels arranged two-dimensionally, wherein the plurality of pixels includes:

a first pixel region including a first pixel configured to emit light and transmit visible light;

a second pixel region arranged around the first pixel region, and including a second pixel configured to emit light with an area larger than a light-emitting area of the first pixel in the first pixel region; and a third pixel region arranged around the second pixel region, and including a third pixel configured to emit light with an area larger than a light-emitting area of the second pixel in the second pixel region, wherein the first pixel in the first pixel region includes a first light emitting region having a predetermined light-emitting area and a first non-light emitting region including a first transmissive window configured to transmit visible light, the second pixel in the second pixel region includes a second light emitting region having a light-emitting area larger than the predetermined light-emitting area, and the third pixel in the third pixel region includes a third light emitting region having a light-emitting area larger than the light-emitting area of the second light emitting region.

2. The image display device according to claim 1, wherein the second pixel in the second pixel region includes a second non-light emitting region including a second transmissive window configured to transmit visible light within a range smaller than the first transmissive window.

3. The image display device according to claim 2, wherein the second pixel in the second pixel region includes a pixel circuit arranged in the second light emitting region and not arranged in the second non-light emitting region.

4. The image display device according to claim 2, wherein the second pixel in the second pixel region includes a pixel circuit arranged in the second light emitting region and the second non-light emitting region.

5. The image display device according to claim 2, wherein the first pixel in the first pixel region and the second pixel in the second pixel region include a plurality of color pixels configured to individually emit light in different colors, and the first transmissive window and the second transmissive window are respectively provided for color pixels of specific colors.

6. The image display device according to claim 2, wherein the first pixel in the first pixel region and the second pixel in the second pixel region include a plurality of color pixels configured to individually emit light in different colors, the first non-light emitting region is provided without the first light emitting region being provided for a color pixel of a specific color in the first pixel region, and the first light emitting region is provided without the first non-light emitting region being provided for a color pixel of a color other than the specific color, the second light emitting region and the second non-light emitting region are provided for a color pixel of the specific color in the second pixel region, and the second light emitting region is provided without the second non-light emitting region being provided, for a color pixel of a color other than the specific color in the second pixel region.

7. The image display device according to claim 1, wherein the second pixel in the second pixel region includes a second non-light emitting region configured not to transmit visible light.

8. The image display device according to claim 1, wherein the second pixel region includes a plurality of pixels having a light-emitting area that decreases continuously or stepwise from the predetermined light-emitting area.

9. The image display device according to claim 1, wherein the second pixel in the second light emitting region includes a self light-emitting element, and the self light-emitting element includes:

a lower electrode layer including a light reflecting surface;

a display layer arranged on the lower electrode layer; and an upper electrode layer arranged on the display layer.

10. The image display device according to claim 9, wherein the upper electrode layer and the display layer have an uneven structure, and an interval between two adjacent protrusions of the uneven structure is irregular.

11. The image display device according to claim 1, wherein a pixel group including the first pixel region and the second pixel region is arranged at a plurality of places in an image display region while being separated from each other, and the third pixel region is arranged around the pixel group at the plurality of places.

12. An electronic device comprising:

an image display device including a plurality of pixels arranged two-dimensionally; and a light receiving device configured to receive light incident through the image display device, wherein the plurality of pixels includes:

a first pixel region including a first pixel configured to emit light and transmit visible light;

a second pixel region arranged around the first pixel region, and including a second pixel configured to emit light with an area larger than a light-emitting area of the first pixel in the first pixel region; and a third pixel region arranged around the second pixel region, and including a third pixel configured to emit light with an area larger than a light-emitting area of the second pixel in the second pixel region, wherein the light receiving device receives light transmitted through the first pixel region, the first pixel in the first pixel region includes a first light emitting region having a predetermined light-emitting area and a first non-light emitting region including a first transmissive window configured to transmit visible light, the second pixel in the second pixel region includes a second light emitting region having a light-emitting area larger than the predetermined light-emitting area, the third pixel in the third pixel region includes a third light emitting region having a light-emitting area larger than a light-emitting area of the second light emitting region, and the light receiving device receives light transmitted through the first non-light emitting region.

13. The electronic device according to claim 12, wherein the second pixel in the second pixel region includes a second non-light emitting region including a second transmissive window configured to transmit visible light within a range smaller than the first transmissive window, and the light receiving device receives light transmitted through the first light emitting region and the second non-light emitting region.

14. The electronic device according to claim 13, wherein the second pixel in the second pixel region includes a pixel circuit arranged in the second light emitting region and not arranged in the second non-light emitting region.

15. The electronic device according to claim 13, wherein the second pixel in the second pixel region includes a pixel circuit arranged in the second light emitting region and the second non-light emitting region.

16. The electronic device according to claim 13, wherein the first pixel in the first pixel region and the second pixel in the second pixel region include a plurality of color pixels configured to individually emit light in different colors, and the first transmissive window and the second transmissive window are respectively provided for color pixels of specific colors.

17. The electronic device according to claim 12, wherein the light receiving device includes at least one of: an imaging sensor configured to photoelectrically convert light incident through the first non-light emitting region; a distance measuring sensor configured to receive light incident through the first non-light emitting region to measure a distance; or a temperature sensor configured to measure a temperature on a basis of light incident through the first non-light emitting region.

* * * * *